US009013009B2

(12) United States Patent
Takahata et al.

(10) Patent No.: US 9,013,009 B2
(45) Date of Patent: Apr. 21, 2015

(54) METHOD FOR PRODUCING HIGH-PURITY LANTHANUM, HIGH-PURITY LANTHANUM, SPUTTERING TARGET FORMED FROM HIGH-PURITY LANTHANUM, AND METAL GATE FILM HAVING HIGHY-PURITY LANTHANUM AS MAIN COMPONENT

(75) Inventors: Masahiro Takahata, Ibaraki (JP); Kazuyuki Satoh, Ibaraki (JP); Satoyasu Narita, Ibaraki (JP); Takeshi Gohara, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 13/980,072

(22) PCT Filed: Jan. 17, 2012

(86) PCT No.: PCT/JP2012/050784
§ 371 (c)(1),
(2), (4) Date: Aug. 6, 2013

(87) PCT Pub. No.: WO2012/099092
PCT Pub. Date: Jul. 26, 2012

(65) Prior Publication Data
US 2013/0313659 A1 Nov. 28, 2013

(30) Foreign Application Priority Data

Jan. 21, 2011 (JP) ................................ 2011-010896
Jan. 21, 2011 (JP) ................................ 2011-010974

(51) Int. Cl.
H01L 29/51 (2006.01)
C25C 3/34 (2006.01)
(Continued)

(52) U.S. Cl.
CPC ... *C25C 3/34* (2013.01); *C22B 9/22* (2013.01); *C22B 59/00* (2013.01); *C22C 28/00* (2013.01); *H01L 21/28079* (2013.01); *H01L 29/517* (2013.01); *C23C 14/3414* (2013.01)

(58) Field of Classification Search
CPC ........ C22C 28/00; C25C 3/34; H01L 29/517; C23C 14/3414
See application file for complete search history.

(56) References Cited

U.S. PATENT DOCUMENTS 4,187,155 A  *  2/1980  de Nora et al. ............... 205/383
4,265,862 A     5/1981  White et al.
(Continued)

FOREIGN PATENT DOCUMENTS

FR     2661425 A1    10/1991
JP     63-011628 A    1/1988
(Continued)

OTHER PUBLICATIONS

Y. Katayama et al., "Precipitation of Rare Earth Compounds in LiCl—KCl Eutectic", J. Electrochem. Soc., vol. 142, No. 7, pp. 2174-2178, Jul. 1995.
(Continued)

Primary Examiner — Whitney T Moore
(74) Attorney, Agent, or Firm — Howson & Howson LLP

(57) ABSTRACT

The present invention addresses the problem of providing a technique capable of efficiently and stably providing a method for producing high-purity lanthanum, the method characterized in that: a crude lanthanum oxide starting material having a purity of 2N-3N, excluding gas components, is used; the material is subjected to molten salt electrolysis at a bath temperature of 450-700° C. to produce lanthanum crystals; the lanthanum crystals are subsequently desalted: and electron beam melting is then performed to remove volatile substances. The present invention also addresses the problem of providing a technique capable of efficiently and stably providing high-purity lanthanum, high-purity lanthanum itself, a sputtering target formed from high-purity material lanthanum; and a thin film for metal gates that has high purity lanthanum as the main component.

20 Claims, 3 Drawing Sheets

(51) Int. Cl.
C22B 9/22 (2006.01)
C22B 59/00 (2006.01)
C22C 28/00 (2006.01)
C23C 14/34 (2006.01)
H01L 21/28 (2006.01)

(56) References Cited

U.S. PATENT DOCUMENTS

| | | | |
|---|---|---|---|
| 5,118,396 | A * | 6/1992 | Claus et al. ............... 205/363 |
| 5,513,834 | A | 5/1996 | Feldewerth et al. |
| 7,344,660 | B2 | 3/2008 | Hosono et al. |
| 2005/0023130 | A1 | 2/2005 | Suzuki et al. |
| 2006/0147335 | A1* | 7/2006 | Bewlay et al. ............... 420/425 |
| 2007/0003790 | A1 | 1/2007 | Tsukatani et al. |
| 2007/0131545 | A1 | 6/2007 | Okabe et al. |
| 2010/0272596 | A1 | 10/2010 | Takahata et al. |
| 2011/0114481 | A1 | 5/2011 | Satoh et al. |
| 2011/0114482 | A1 | 5/2011 | Satoh et al. |
| 2011/0162322 | A1 | 7/2011 | Satoh et al. |
| 2011/0290644 | A1 | 12/2011 | Tsukamoto et al. |
| 2011/0308940 | A1 | 12/2011 | Tsukamoto et al. |
| 2012/0045380 | A1 | 2/2012 | Satoh et al. |
| 2013/0241010 | A1 | 9/2013 | Takahata et al. |
| 2013/0277214 | A1 | 10/2013 | Narita et al. |
| 2014/0199203 | A1 | 7/2014 | Takahata et al. |

FOREIGN PATENT DOCUMENTS

| | | |
|---|---|---|
| JP | H04-176889 A | 6/1992 |
| JP | H08-092662 A | 4/1996 |
| JP | 10-287402 A | 10/1998 |
| JP | H10-273743 A | 10/1998 |
| JP | 2007-169683 A | 7/2007 |

OTHER PUBLICATIONS

E. Tokumitsu et al., "A Study on High-Dielectric-Constant Oxide Materials for MOSFET Gate Insulator Applications", Denshi-zairyo Kenkyu-kai Shiryo of Institute of Electrical Engineers of Japan, vol. 6-13, pp. 37-41, Sep. 21, 2000.

K. Shima, "Process of High-Purity Metals and Physical Property", CMC Publishing Co., Ltd., Trade Edition, 1st Printing, pp. 8 and 124-129, Dec. 2000.

Shi Fu, "Refinement of Rare Earth Metal", Publisher of Inner Mongolia University, Chapter 9, p. 216, Aug. 1994.

Kouji Mimura et al., "Purification of Metals Ce and La by Plasma Zone Melting Method", Collected Abstracts of the 2006 Spring Meeting of the Japan Institute Metals, the Japan Institute Metals, vol. 138, p. 304, Mar. 21, 2006.

L.O. Valoen et al., "Structure and Related Properties of (La, Ce, Nd, Pr)Ni5 Alloys", Journal of Alloys and Compounds, Elsevier, vol. 306, No. 1-2, pp. 235-244, Jun. 1, 2000.

P. Patnaik Ph.D., "Handbook of Inorganic Chemicals, Lanthanum", McGraw-Hill, pp. 443-446, 2003 (month unknown).

Zhang Di et al, "Characterization of Stacking Faults on Basal Planes in Intermetallic compunds La5Ni19 and La2Ni7", Intermetallics, Elsevier, vol. 8, No. 4, pp. 391-397, Apr. 1, 2000.

Theodosia Gougousi et al., "Properties of La-Silicate High-K Dielectric Films Formed by Oxidation of La on Silicon", Journal of Applied Physics, American Institute of Physics, vol. 93, No. 3, pp. 1691-1696, Feb. 1, 2003.

W.R. Pedreira et al., "Determination of Trace Amounts of Rare Earth Elements in High Pure Lanthanum Oxide by Sector Field Inductively Coupled Plasma Mass Spectrometry (HR ICP-MS) and High-Performance Liquid Chromatography (HPLC) Techniques", Journal of Alloys and Compounds, Elsevier, vol. 344, No. 1-2, pp. 17-20, Oct. 7, 2002.

Zhi Youbao, "Problems of Rare Earth Minerals Production in China and Its Future", Gansu Metallurgy, vol. 29, No. 1, pp. 44-45, Feb. 2007.

Rare Handbook Editorial Board, "Rare Manual", Metallurgical Industry Press, p. 927, 1995 (month unknown).

* cited by examiner

Patterns (color irregularities) on surface of ingot optical microscope

EPMA identity of color irregularities on the surface
↓
aggregates of oxides
(no oxides detected outside of the area of color irregularities)

Model of aggregation in skull melting

METHOD FOR PRODUCING HIGH-PURITY LANTHANUM, HIGH-PURITY LANTHANUM, SPUTTERING TARGET FORMED FROM HIGH-PURITY LANTHANUM, AND METAL GATE FILM HAVING HIGHY-PURITY LANTHANUM AS MAIN COMPONENT

BACKGROUND

The present invention relates to a high-purity lanthanum, a method for producing high-purity lanthanum, a sputtering target formed from high-purity lanthanum, and a metal gate film having high-purity lanthanum as main component.

Lanthanum (La) is one of rare earth elements that exist in the form of mixed complex oxides as mineral resources in earth's crust. Rare earth elements were named as such since they were originally isolated from relatively rare minerals. However, their existence is not so rare if whole of earth's crust is taken into account.

The atomic number of Lanthanum is 57. It is a silvery white metal with atomic weight of 138.9 and has a multi hexagonal close-packed structure at ambient temperature. It has the melting point of 921° C., boiling point of 3500° C., and density of 6.15 g/cm$^3$, and its surface is oxidized in air. It melts slowly in water, and is soluble in hot water as well as in acid. It is not ductile but exhibits slight malleability. Its specific resistance is 5.70×10$^{-6}$ Ωcm. It combusts at 445° C. and above and forms an oxide ($La_2O_3$)(see Encyclopedia of Physical Chemistry).

Rare earth elements in general are stable as compounds with oxidation number of three, and lanthanum is also trivalent. Recently, a lot of research and development have focused on lanthanum as electronic material such as metal gate material and high dielectric constant material (High-k), making it one of the metals that is drawing a lot of attention.

Metal lanthanum has the problem of being readily oxidized during the purification process, and as such, it is a difficult material to work with in a highly purified form. For this reason, no highly purified product of lanthanum has been made available to date. In addition, metal lanthanum turns black by oxidation in a short period of time when left exposed to air, creating additional problem for handling.

In the next generation MOSFET, gate insulator needs to become even thinner than it currently is. $SiO_2$, which has been traditionally used as gate insulator, however, is approaching its limits in usefulness in that it is increasingly becoming difficult to function properly at the required thinness, because of the increase in the leak current due to tunnel effect.

For this reason, $HfO_2$, $ZrO_2$, $Al_2O_3$ and $La_2O_3$ having high dielectric constant, high thermal stability and high energy barrier against electron holes and electrons in silicon, have been proposed as its potential alternatives. Among these materials, $La_2O_3$ is considered to be especially promising, and as such, its electrical characteristics have been studied, and its potential as gate insulator in the next generation MOSFET has been reported (see non-patent document 1). However, in this particular non-patent document, the subject of the study is limited to $La_2O_3$ film, and the characteristics and behavior of lanthanum element are not explored.

On the other hand, a technology in which halogenated rare earth metals are reduced by calcium or hydrogenated calcium was proposed about 2 decades ago as a method for isolating rare earth metals. This document listed lanthanum as an example of rare earths. However, the technology was a rudimentary one involving slag separating jig as a means of separating slag, and did not particularly disclose much about the problems associated with the use of metal lanthanum element as well as the method for its purification (see Patent Document 1).

As discussed above, the use of lanthanum (lanthanum oxide) is still in its early days and more research is required. In studying the property of lanthanum (lanthanum oxide), having a metal lanthanum itself as a sputtering target material would be highly beneficial because it would enable the formation of lanthanum thin film on a substrate and facilitate the research into the behavior of its interface with the silicon substrate as well as the properties of high dielectric constant gate insulator and the like made from lanthanum compounds produced. In addition, it would also greatly enhance the freedom of its use in various final products.

However, the problem of oxidation that can occur rapidly (in about 10 minutes) when exposed to air would persist even if such a lanthanum sputtering target is produced. Once the oxidized film is formed on the target, it would result in the reduction of electric conductivity and lead to defects in sputtering. Moreover, if the target is left exposed to air for a long period of time, it would react with the moisture in the air and can become covered with white hydroxide powder, which in turn makes sputtering impossible.

For this reason, measures for preventing oxidation, such as packing in vacuum and covering with oil, need to be taken immediately after the production of target. However, these are extremely cumbersome processes. Due to these problems, the target material using lanthanum element still has not been realized. As Patent Documents, there are three listed below (Patent Document 2 to Patent Document 5), by the same applicants of the present application.

Furthermore, generation of nodules on the surface of the target poses another problem when forming a film by sputtering with lanthanum target. These nodules elicit abnormal discharge, generating particles from the eruption of the nodules and the like.

Generation of particles in turn can increase the defect rate of metal gate films, semi-conductor elements and devices. Especially problematic is the presence of carbon (graphite), which is a solid. Since graphite is conductive, it is difficult to be detected. Thus improvement needs to be made to reduce its presence.

Although lanthanum, as discussed earlier, is a material hard to prepare in highly purified form, it is preferable to reduce the content of Al, Fe and Cu in addition to carbon (graphite) mentioned above, in order to take full advantage of the property of lanthanum. Furthermore, the presence of alkaline metals, alkali earth metals, transition metal elements, high melting point metal elements, and radioactive elements all adversely affect the property of semi-conductor and therefore need to be reduced. From these considerations, the purity of lanthanum is preferably 5N or more.

In the Patent Document 5 below, there is a disclosure about reducing the contents of Al, Fe and Cu to 100 wtppm, respectively, by acid washing and ultrasonic cleaning the lanthanum raw material, followed by electron beam melting. The Example 2 therein achieved Al content of 5.5 wtppm, Fe content of 3.5 wtppm and Cu content of 2.8 wtppm. Patent Document 5 succeeded in significantly reducing the contents of these elements and represented a considerable step forward. However, further improvement in the purity was needed, and the method for achieving that goal had to be researched and developed.

However, a problem exists in the extreme difficulty of removing rare earths, particularly lanthanoids other than lanthanum. Fortunately, minor contamination of lanthanoids other than lanthanum poses no major issues since their properties are similar enough to that of lanthanum. There are also materials containing less amounts of rare earths that can be used as the raw material. If further reduction of rare earths is required in particular, these materials can be used as the starting material. Likewise, minor contamination of gas components also poses no major problems. Gas component is generally very difficult to remove, and it is customary not to include the contribution from the gas component when indicating the purity.

Topics such as the physical property of lanthanum, production method for highly purified lanthanum, behavior of impurities in lanthanum target, have not been extensively explored to date. Therefore, it is highly desirable that these problems are adequately addressed as soon as possible.

Patent Document 1: Japanese Unexamined Patent Application Publication No. S63-11628
Patent Document 2: Japanese Patent Application No. 2009-547950
Patent Document 3: Japanese Patent Application No. 2009-078836
Patent Document 4: Japanese Patent Application No. 2009-084078
Patent Document 5: PCT International Publication No. WO2009/084318
Non-Patent Document 1: Eisuke Tokumitsu et. al. "Study of oxide materials for High-k gate insulator". Research material for The Institute of Electrical Engineers of Japan, Committee on Electronic Materials. Vol. 6-13, page 37-41. Sep. 21, 2001.

SUMMARY OF INVENTION

Technical Problem

The present invention aims at providing a technique capable of stably providing a production method for high-purity lanthanum, a high-purity lanthanum, a sputtering target made from the high-purity lanthanum, a metal gate film formed using the sputtering target, and semi-conductor elements and devices equipped with the metal gate film.

Solution to Problem

The present invention provides a method for producing high-purity lanthanum, characterized in that: a crude lanthanum raw material having a purity of 2N to 3N, excluding gas components, is used as the starting material; the material is subjected to molten salt electrolysis at a bath temperature of 450-700° C. to produce lanthanum crystals; the lanthanum crystals are subsequently desalted; and electron beam melting is then performed to remove volatile substances.

As to the molten salt electrolytic bath, more than one type of electrolytic bath selected from potassium chloride (KCl), lithium chloride (LiCl), and lanthanum chloride ($LaCl_3$) can be used. And, an anode made from Ta can be used in molten salt electrolysis.

In addition, for the desalting process, separation of the metal and salt by utilizing the difference in vapor pressure can effectively be performed by using a desalting furnace and applying heat in vacuum at a temperature of 850° C. or less.

High-purity lanthanum having a purity of 5N or more, excluding rare earth metals and gas components, but having the contents of aluminum (Al), iron (Fe) and copper (Cu), at 1 wtppm or less respectively in the lanthanum, can thus be obtained.

The high-purity lanthanum are novel substances, and the present invention encompasses them. LaOx film is formed in the majority of cases where it is used as gate insulator in MOSFET. In forming such a film, high-purity metal lanthanum is required so as to have more freedom in formation of films to form any types of film. The present invention can provide material according to this purpose.

Rare earth elements contained In lanthanum include Sc, Y, Ce, Pr, Nd, Pm, Sm, Eu, Gd, Tb, Dy, Ho, Er, Tm, Yb, and Lu in addition to La, and their similarity in physical properties make it difficult to separate them from La. Especially, Ce, being very similar to La, is extremely difficult to reduce.

However, since the physical properties of these rare earth elements are similar, total amount of contaminating rare earth elements that is less than 100 wtppm poses no particular problems for use as the materials for electronics parts. Therefore, this level of contaminating rare earth elements is tolerated in the lanthanum of the present invention.

Generally, gas components include C, N, O, S and H. These can exist as individual elements or as compounds such as CO, $CO_2$, $SO_2$, or as compounds with constituent elements. Because these gas component elements have smaller atomic weight and atomic radius, they do not largely affect the properties of the material as contaminating impurities, as long as they are not contained in excessive amounts. Therefore, the purity is customarily indicated as the purity excluding the gas components. The purity of lanthanum in the present invention is also indicated as 5N or more, excluding gas components.

In addition, the present invention provides a high-purity lanthanum having a total content of W, Mo and Ta of 10 wtppm or less. Moreover, the total content further including aluminum (Al), iron (Fe) and copper (Cu) is preferably 10 wtppm or less. In addition, a high-purity lanthanum having the impurities of U and Th respectively of 1 ppb or less is provided. It is preferable to reduce these elements as much as possible because they represent the impurities that deteriorate the property of semi-conductors.

Moreover, the present invention achieves the α-ray count of 0.001 $cph/cm^2$ or less, and provides a high-purity lanthanum having a purity of 5N or more excluding rare earth elements and gas components, and having the α-ray count of 0.001 $cph/cm^2$ or less.

The present invention provides a sputtering target made from the high-purity lanthanum above, a metal gate film formed using the sputtering target, and semi-conductor elements and devices equipped with the metal gate film.

As described above, LaOx film is formed in the majority of cases where it is used as gate insulator in MOSFET. In forming such a film, high-purity metal lanthanum is required so that one can have more freedom in the formation of the film to form any types of film. The present invention can provide material that suites this requirement. Thus, the high-purity lanthanum of the present invention includes those produced in combination with other substances when preparing targets.

The high-purity lanthanum obtained as described above is subjected to vacuum melting, and solidified into ingot. The ingot thus produced can be cut into prescribed sizes, and formed into sputtering target after grinding. High-purity lanthanum target having a purity of 5N or more excluding rare earth elements and gas components wherein Al, Fe and Cu are each contained in an amount of 1 wtppm or less, can thus be obtained.

Moreover, by performing sputtering using the target, a metal gate film having the same composition can be obtained. The sputtering target, metal gate film, and semi-conductor elements and devices using these, are all novel substances and included in the scope of the present invention.

In addition, the present invention provides a metal lanthanum having an oxygen concentration in the lanthanum of 500 wtppm or less, and especially a metal lanthanum having no color irregularities due to aggregation of oxides.

LaOx film is formed in the majority of cases where it is used as gate insulator in MOSFET. In forming such a film, metal lanthanum having low oxygen concentration is required so that one can have more freedom in the formation of the film to form any types of film. The present invention can provide material that suites this requirement.

Sometimes a segregation of impurities inside the lanthanum ingot occurs, partly due to problems experienced during the production process. The segregating substances are impurities mainly formed from oxides.

When lanthanum ingot is subjected to machine processing and sputtering target is cut out, areas with discoloration (color irregularities) may be observed. Analysis of the area with color irregularities revealed that it is formed from oxides.

Such a segregation existing inside a target is not preferable because it can lead to an accumulation of impurities during the sputtering and cause the unevenness of the ingredients.

In general, the segregation caused by gas components in the lanthanum has to be avoided. Achieving this is one of the aims of the present invention.

In the production of metal lanthanum, a method for producing high-purity lanthanum comprising the steps of slow cooling a lanthanum ingot formed after skull melting until segregation of oxides within the lanthanum ingot is no longer observed, except for the bottom part of the ingot; machine processing the skull ingot obtained by slow cooling; removing the oxides present in the bottom part of the ingot; acid washing the ingot subjected to machine processing; and performing electron beam (EB) melting to produce an EB ingot, can be employed. The ingot subjected to electron (EB) melting can achieve the oxygen content of 500 wtppm or less. These are all encompassed in the present invention.

In regard to the metal lanthanum sputtering target of the present invention, a metal lanthanum sputtering target having an oxygen concentration in the lanthanum target of 500 wtppm or less, and especially a metal lanthanum sputtering target having no color irregularities due to oxide aggregation within the target and no segregation of oxide, can be provided by following these steps.

In removing oxides from metal lanthanum sputtering target, a method based on the method for producing lanthanum ingot described above, comprising the steps of slow cooling a lanthanum ingot formed after skull melting until segregation of oxides within the lanthanum ingot is no longer observed, except for the bottom part of the ingot; machine processing the skull ingot obtained by slow cooling; removing the oxides present in the bottom part of the ingot; acid washing the ingot subjected to machine processing; performing electron beam (EB) melting to produce an EB ingot; and machine processing the EB ingot, can be employed. Sputtering target can then be made by cutting the ingot into the prescribed sizes and grinding. A uniform metal lanthanum sputtering target having no segregation of impurities can thus be obtained.

Using the sputtering target thus produced and forming a film by sputtering, a metal gate film having metal lanthanum as main component wherein the oxygen concentration of the lanthanum component is 500 wtppm or less, can be provided.

Since there is no segregation due to impurities in the target, the generation of particles can be suppressed. The sputtering target and the metal gate film are both novel substances and encompassed within the scope of the present invention.

Effects of Invention

The present invention achieves the excellent effect of stably providing a production method for high purity lanthanum, a high-purity lanthanum, a sputtering target made from the high-purity lanthanum, a metal gate film formed using the sputtering target, and semi-conductor elements and devices equipped with the metal gate film.

DETAILED DESCRIPTION OF INVENTION

In the present invention, a crude lanthanum oxide starting material having a purity of 4N or less excluding gas components, can be used as the high-purity lanthanum raw material. These raw materials contain Li, Na, K, Ca, Mg, Al, Si, Ti, Fe, Cr, Ni, Mn, Mo, Ce, Pr, Nd, Sm, Ta, W, and gas components (N, O, C and H) and the like as major impurities.

Aluminum (Al) and Copper (Cu), contained in lanthanum as contaminants, are often used in alloy materials found in semi-conductor parts such as substrate, source and drain, and as such, can be a cause of malfunction if present in the gate material, even at a small amount. In addition, Iron (Fe) contained in lanthanum is readily oxidized and can cause defective sputtering when used as target. Furthermore, even if it is not oxidized while being inside the target, it could become oxidized after being sputtered. When this occurs, the volume expansion would lead to defects such as insulation failure and ultimately to malfunction. For all of these reasons, reduction of these contaminants is required.

The raw material contains large amounts of Fe and Al. As to Cu, it tends to contaminate through the water-cooling parts used when reducing chlorides and fluorides for the production of crude metals. In the lanthanum raw materials, these contaminating elements tend to exist as oxides.

In addition, as the lanthanum raw material, lanthanum fluoride or lanthanum oxide subjected to reduction by calcium is often used. Since the reducing agent calcium contains impurities such as Fe, Al and Cu, impurities from the reducing agent is often the source of contamination.

(Molten Salt Electrolysis)

Figure 1:
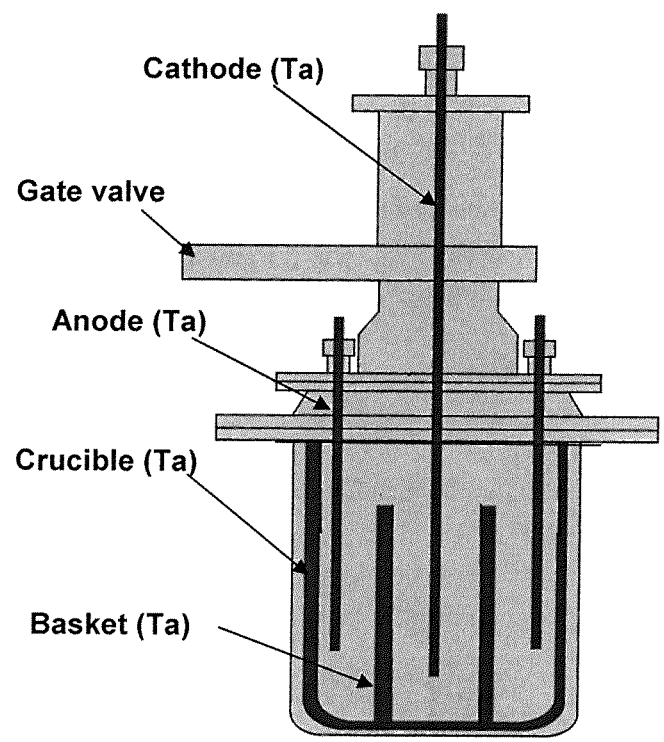
FIG. 1 is a diagram showing an example of molten salt electrolysis apparatus.

The present invention performs molten salt electrolysis in order to increase the purity of the lanthanum and to achieve the purity of 5N or more. FIG. 1 is a diagram showing an example of molten salt electrolysis apparatus. As can be seen in FIG. 1, an anode made from Ta is placed at the bottom of the apparatus. Ta is used as a cathode.

Parts that come into contact with the electrolytic bath and electrodeposit are all made from Ta for preventing contamination. Ti, Ni and the like that are often used in molten salt electrolysis of other metals are not appropriate here because they tend to form an alloy with La.

A basket for separating the La raw material and electrodeposit is placed in the middle bottom part. Upper half of the apparatus is the cooling tower. This cooling tower and electrolysis tank is separated by a gate valve.

As to the composition of the bath, one or more kind of potassium chloride (KCl), lithium chloride (LiCl), sodium chloride (NaCl), magnesium chloride ($MgCl_2$) Lanthanum chloride ($LiCl_3$), and calcium chloride ($CaCl_2$) can be arbitrarily selected and used.

The temperature of the electrolytic bath is preferably adjusted between 450 to 700° C. Though the bath temperature does not have a major impact on the electrolysis, high temperature causes increase in evaporation of salt that constitute the bath, leading to the contamination of the gate valve and cooling tower. This should be avoided since the cleaning can become too cumbersome.

On the other hand, handling becomes easier as the temperature is lowered. However, when the temperature is too low, it can cause a decrease in the fluidity of the bath, leading to an uneven distribution of the composition of the bath, and to a tendency of not being able to obtain a high-purity electrodeposit. Thus, the range mentioned above is the preferable range.

The atmosphere should be an inactive atmosphere. Normally, Ar gas is allowed to flow. As to the material of the anode, a material that does not cause contamination is preferable. In that sense, the use of Ta is preferable. As to the material of the cathode, Ta is used. It is notable that in molten salt electrolysis of rare earths, graphite is generally used. However, this can cause contamination of carbon, which should be avoided in the present invention.

(Conditions for Electrolysis)

Any current density can be chosen as long as it is within the range of 0.025 to 0.5. Voltage was set at around 1.0V. However, since these conditions depend on the size of the apparatus, it is possible to set the conditions differently. Electrodeposit shown in FIG. 2 was obtained. Duration of the electrolysis is usually between 4 to 24 hours. When the molten salt electrolysis apparatus described above is used, electrodeposit weighing about 150 to 500 g can be obtained.

(Desalting Furnace)

Using a desalting furnace, metal and salt are separated by vacuum heating, by taking advantage of the difference of vapor pressures. Normally, the desalting temperature is 850° C. or less, and duration is for 1 to 4 hours, however, depending on the amount of the raw material, it can be adjusted appropriately. The weight of the electrodeposited La was reduced by about 5 to 35% by the desalting.

In other words, the amount of Cl is reduced by about 5 to 35% by the desalting. The content of chloride (Cl) in the La after the desalting treatment was 50 to 3000 ppm.

(Electron Beam Melting)

The electron beam melting of the above obtained lanthanum molded body is performed by wide range irradiation of a low output electron beam to the molten lanthanum raw material in a furnace. It is usually performed in the range of 9 kW to 32 kW. The electron beam melting can be repeated several times (two to four times). Repetition of the electron beam melting improves the removal of volatile elements such as Cl.

W, Mo and Ta cause an increase in the leak current and results in a decrease in the pressure-resistance. Therefore, for use in electronic parts, the total amount of these needs to be 10 wtppm or less.

Rare earth elements need to be removed from the high-purity lanthanum as described above because it is technically very difficult to remove them during the production process of the high-purity lanthanum due to the similarity of chemical properties between lanthanum and other rare earth elements, and because it would not drastically alter the properties of the lanthanum even if there are some contaminations due to this similarity.

From these considerations, some contaminations of other rare earth elements are tolerated, up to a certain point. However, it goes without saying that it is preferable to keep the contamination to a minimum, in order to achieve improvement on the property of the lanthanum itself.

In addition, the reason for having a purity excluding gas components of 5N or more is because removal of gas components is difficult and if it is incorporated into purity considerations, the purity would no longer reflect improvements in actual purity. Moreover, compared with other contaminating elements, their presence, up to a certain level, is harmless in general.

Sputtering is employed in many cases where a thin film is formed for use in electronic materials such as gate insulators and thin films for metal gate, and is considered to be a superior method for forming a thin film. Therefore, producing a high-purity lanthanum sputtering target using the lanthanum ingot described above is an effective approach.

Target can be produced following the conventional processes including forging, rolling, cutting, finishing (grinding) and the like. There are no particular limitations to the production process and any processes can be arbitrarily selected.

A high-purity lanthanum having a purity of 5N or more excluding gas components, and having Al, Fe and Cu each at an amount of 1 wtppm or less, and further having the total amount of impurities including W, Mo and Ta (as the material for the crucible) being less than 10 wtppm, can thus be obtained.

In producing the target, the high-purity lanthanum ingot described above is first cut into prescribed size and then is trimmed and grinded further.

Using the obtained high-purity lanthanum target, a high-purity lanthanum film can be formed on a substrate by sputtering. As a result, a metal gate film having a high-purity lanthanum as the main component with a purity of 5N or more excluding rare earth elements and gas components, and Al, Fe and Cu each at 1 wtppm or less can be formed on a substrate. The film on the substrate reflects the composition of the target, thus, allowing one to form a high-purity lanthanum film.

The present invention may employ commercially available lanthanum fluorides having a purity of 4N or more excluding gas components as the starting material for highly purified lanthanum. These raw materials contain Li, Na, K, Ca, Mg, Al, Si, Ti, Fe, Cr, Ni, Mn, Mo, Ce, Pr, Nd, Sm, Ta and W as the main impurities, however, their contents are small. Especially, they are notable for having very small contents for rare earth elements.

The commercially available lanthanum fluorides contains high amounts of gas components (N, O, C and H), thus cannot be used without pretreatment.

Aluminum (Al) and Copper (Cu), contained in lanthanum as contaminants, are often used in alloy materials found in semi-conductor parts such as substrate, source and drain, and as such, can be a cause of malfunction if present in the gate material, even at a small amount. In addition, Iron (Fe) contained in lanthanum is readily oxidized and can cause defective sputtering when used as target. Furthermore, even if it is not oxidized while being inside the target, it could become oxidized after being sputtered. When this occurs, the volume expansion would lead to defects such as insulation failure and ultimately to malfunction. For all of these reasons, reduction of these contaminants is required.

The raw material contains large amounts of Fe and Al. As to Cu, it tends to contaminate through the water-cooling parts used in reducing chlorides and fluorides for the production of crude metals. In the lanthanum raw materials, these contaminating elements tend to exist as oxides.

As the lanthanum raw material, lanthanum fluoride can be used. When lanthanum fluoride is used, it is subjected to reduction by calcium. However, since calcium that is the reducing agent contains impurities such as Fe, Al and Cu, there is always a possibility of contamination by the impurities contained in the reducing agent. A comparison of analytical data of commercially available Ca is shown in Table 1. The commercially available Ca of Table 1 has a high Cu content of 95 wtppm. Thus the risk of Cu contamination would be high if this commercially available Ca is used.

TABLE 1

| element | wtppm |
|---|---|
| Li | 0.35 |
| Be | <0.05 |
| B | <0.05 |
| F | <1 |
| Na | 0.33 |
| Mg | 5.2 |
| Al | 1.4 |
| Si | 1.5 |
| P | <0.05 |
| Cl | ~2100 |
| K | <0.5 |
| Ca | |
| Sc | <0.01 |
| Ti | 0.57 |
| V | 0.09 |
| Cr | 0.16 |
| Mn | 26 |
| Fe | <0.05 |
| Co | <0.05 |
| Ni | <0.1 |
| Cu | 95 |
| Zn | <0.1 |
| Ga | <0.05 |
| Ge | <0.5 |
| As | =<50 |
| Se | =<10 |
| Br | <0.5 |
| Rb | <0.05 |
| Sr | =<1200 |
| Y | <0.1 |
| Zr | <0.05 |
| Nb | <0.1 |
| Mo | <0.5 |
| Ru | <1 |
| Rh | <0.1 |
| Pd | <0.5 |
| Ag | <0.5 |
| Cd | <5 |
| In | <0.5 |
| Sn | <0.5 |
| Sb | <0.1 |
| Te | <0.5 |
| I | <1 |
| Cs | <0.5 |
| Ba | 8.5 |
| La | <0.05 |
| Ce | <0.05 |
| Pr | <0.05 |
| Nd | <0.05 |
| Sm | <0.05 |
| Eu | <0.05 |
| Gd | <0.05 |
| Tb | <0.05 |
| Dy | <0.05 |
| Ho | <0.05 |
| Er | <0.05 |
| Tm | <0.05 |
| Yb | <0.05 |

TABLE 1-continued

| element | wtppm |
|---|---|
| Lu | <0.05 |
| Hf | <0.05 |
| Ta | <5 |
| W | <0.1 |
| Re | <0.05 |
| Os | <0.05 |
| Ir | <0.05 |
| Pt | <0.05 |
| Au | <1 |
| Hg | <0.1 |
| Tl | <0.05 |
| Pb | <0.05 |
| Bi | <0.05 |
| Th | <0.005 |
| U | <0.005 |
| C | 48 |
| N | 13 |
| O | 16 |
| S | <10 |
| H | 23 |

(Reduction with Calcium)

The melting crucible used for the reduction was made of tantalum (Ta). Powdery $LaF_3$ and lump Ca were mixed and placed inside this tantalum crucible. Ca generally used as the reducing material was added at an amount of about 10% in excess of the calculated amount.

The content of the tantalum crucible placed within a reduction apparatus was slowly heated to 600° C., during which time, the reduction apparatus was evacuated and the content was degassed. Purified Argon gas was then injected to atmospheric pressure of 0.5.

The content is further heated and the reaction is initiated when the temperature of the content reaches 800° C. to 1000° C. The reaction formula is $2LaF_3+3Ca \rightarrow 2La+3CaF_2$. Since the reaction is exothermic reaction, it is completed rapidly. To improve the separation of purified metal and slag, the temperature is maintained for several minutes at a temperature around 50° C. higher than the melting point of metal La.

The yield of metal La is about 97%. Main impurities are unreacted reducing material and slag. Furthermore, because there is a possibility for Ta in the crucible to contaminate as an impurity, the reducing reaction is preferably conducted at a lowest temperature possible. The metal La is thus obtained.

(Electron Beam Melting)

The electron beam melting of the lanthanum molded body is performed by wide range irradiation of a low output electron beam to the molten lanthanum raw material in a furnace. Though it will be a repetition of the description about electron beam melting in paragraph 0044, it is described here. The electron beam melting is usually performed in the range of 9 kW to 32 kW, and can be repeated several times (two to four times). Repetition of the electron beam melting improves the removal of elements having high vapor pressure such as Ca, Mg, Mn, and Pb.

An increase in the output of the electron beam results in the residual oxygen reacting with C, and has an effect of improving the removal of carbon contaminating the lanthanum, as CO gas or $CO_2$ gas. However, excessive increase of the output may result in the contamination of Cu that constitutes the water-cooled parts of the furnace directly in contact with the lanthanum therein; therefore, the output should be kept within certain levels.

W, Mo and Ta cause an increase in the leak current and results in a decrease in the pressure-resistance. Therefore, for use in electronics parts, the total amount of these needs to be 1 to 10 wtppm.

In general, when producing high-purity lanthanum, rare earth elements other than lanthanum are removed. This is because it is technically very difficult to remove them during the production i.e., purification process of the high-purity lanthanum due to the similarity of chemical properties between lanthanum and other rare earth elements, and because it would not drastically alter the properties of the lanthanum even if there are some contaminations due to this similarity. From these considerations, some contaminations of other rare earth elements are tolerated, up to a certain point. However, it goes without saying that it is preferable to keep the contamination to a minimum, in order to achieve improvement on the property of the lanthanum itself.

However, as described earlier, when the commercially available high-purity lanthanum fluoride having a purity of 5N level is used as the starting material and is subjected to reduction with calcium, the lanthanum product obtained at the end would reflect the low content of the rare earth elements in the lanthanum raw material, thus allowing one to obtain a lanthanum in which amounts of rare earth elements are reduced.

In addition, the reason for having a purity excluding gas components of 4N5 or more is because removal of gas components is difficult and if it is incorporated into purity considerations, the purity would no longer reflect improvements in actual purity. In addition, their presence, compared with other contaminating elements up to a certain level, is harmless in general.

Sputtering is employed in many cases where a thin film is formed for use in electronic materials such as gate insulators and thin films for metal gate, and is considered to be a superior method for forming a thin film. Therefore, producing a high-purity lanthanum sputtering target using the lanthanum ingot described above is an effective approach.

Target can be produced following the conventional processes including forging, rolling, cutting, finishing (grinding) and the like. There are no particular limitations to the production process and any processes can be arbitrarily selected.

A high-purity lanthanum ingot having a purity of 4N5 or more excluding gas components, and having C at an amount of 200 wtppm or less, Al and Fe each of 5 wtppm or less, and Cu of 1 wtppm or less, can thus be obtained. In addition, the total amount of W, Mo and Ta can be reduced to 1 to 10 wtppm.

In regard to carbon (C) above, it is one of the gas components. By limiting the amount of gas component of C to 200 wtppm or less, the property of the lanthanum is expected to improve. In producing the target, the high-purity lanthanum ingot described above is first cut into prescribed size and then is trimmed and grinded further.

Using the obtained high-purity target, a high-purity lanthanum film can be formed on a substrate by sputtering. As the result, a metal gate film having a high-purity lanthanum as the main component, having a purity of 4N5 or more excluding gas components, C of 200 wtppm or less, Al and Fe each of 5 wtppm or less, and Cu of 1 wtppm or less can be formed on a substrate. The film on the substrate reflects the composition of the target, thus, allowing one to form a high-purity lanthanum film.

Next, the invention for reducing oxygen level in the metal lanthanum is described. In order to reduce oxygen level, it is preferable to perform skull melting, which is one form of induction melting with use of water-cooled copper crucible. The method for reducing the amount of oxygen described below can be effectively performed after the electrolysis purification method described above but before the purification by the electron beam melting.

Figure 3:
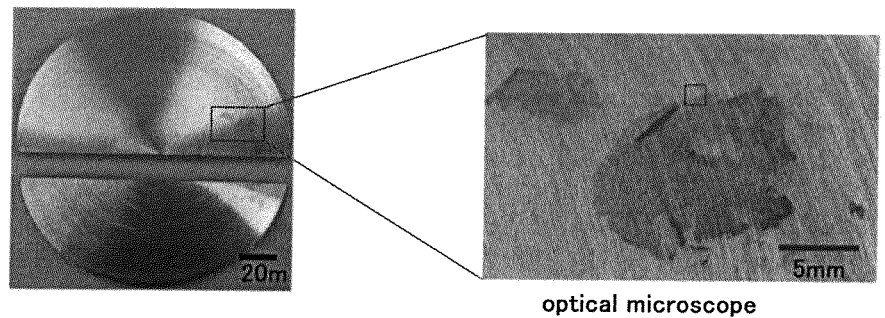
FIG. 3 is a figure showing the color irregularities of ingot (target), magnified view using an optical microscope of areas of color irregularities, and the result of analysis of the area of color irregularities.
Figure 3:
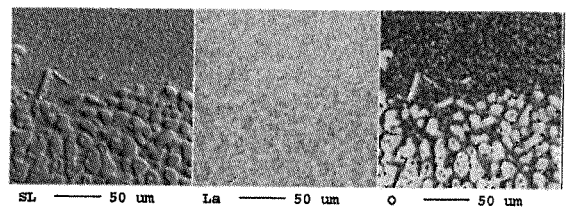

However, simple skull melting the electrodeposited lanthanum obtained by the electrolysis method, followed by acid washing and electron beam (EB) melting, often leads to color irregularities in the target. Color irregularities are observed at the step of ingot, prior to the processing of target. FIG. 3 shows the occurrence of color irregularities. Color irregularities can be observed in the ingot in the top left panel of FIG. 3. Top right panel of FIG. 3 shows the magnified image by an optical microscope. Color irregularities in which the change of color spans about 5 to 20 mm, can be observed.

The result of an analysis of this area of color irregularities is shown in the lower panel of FIG. 3. The lower panel of FIG. 3 shows EPMA mapping. This reveals that the color irregularities are made of aggregated oxides. The presence of oxides is never observed outside of the area of color irregularities.

Thus a method for eliminating or reducing the aggregates of oxides has to be developed. The inventors of the present invention worked diligently to solve this, and discovered that slow cooling the lanthanum ingot until no segregated oxides can be observed inside the lanthanum ingot, except for the bottom part, is effective.

Figure 4:
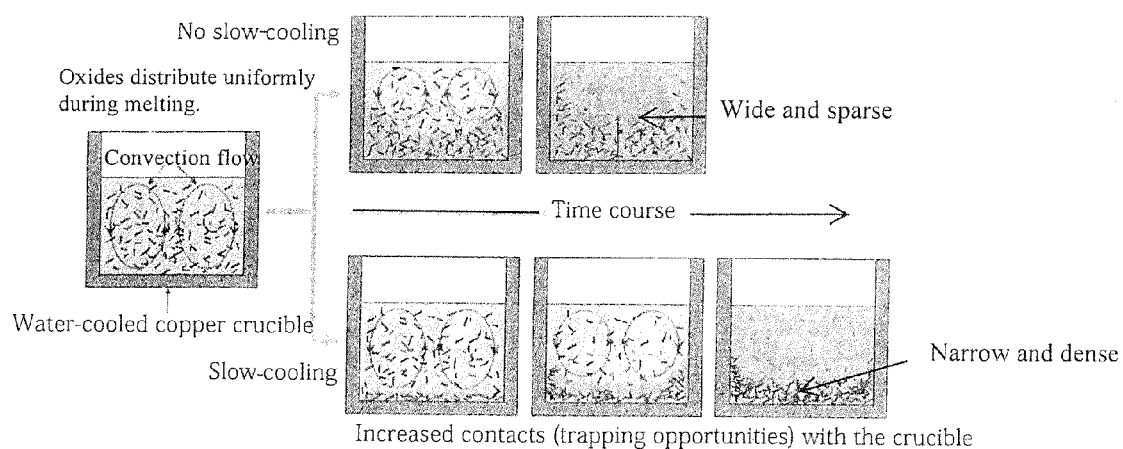
FIG. 4 is a conceptual diagram showing the convection flow of molten metal as well as the distribution of oxides, when lanthanum is skull melted with skull melting furnace.

With skull melting the lanthanum raw material in the conventional method, generally tabular lanthanum (ingot) raw material is used, which leads to the aggregation of oxides. After the study of the cause, a phenomenon depicted in the schematic diagram of FIG. 4 was postulated as the cause of this aggregation. Left panel of FIG. 4 depicts the convection flow in the molten metal during the skull melting, as well as the distribution pattern of oxides. The oxides are thought to be uniformly distributed by the convection flow in the molten metal.

After skull melting and subsequent cooling, the oxides floating in the molten metal of lanthanum gradually sink to the bottom of the crucible. However, a portion of oxides stay afloat in the lanthanum and solidifies into ingot, which is usually called "skull ingot". The schematic diagram depicting this process is shown in the upper right panel of FIG. 4.

When a target is cut out from an ingot in this state, the oxides that exist inside the ingot would appear inside or on the surface of the target. This is the cause of the aggregation of the oxides and of the consequent color irregularities.

In order to avoid the situation shown in the upper right panel of FIG. 4, slow cooling becomes necessary as shown in lower right panel of FIG. 4. Slow cooling increases the contact between the floating oxides and the crucible, and more of the oxides becomes trapped by the crucible and particularly accumulates at the bottom of the crucible. As the amount of accumulation increases, the amount of oxides floating inside the molten metal (at the core) conversely decreases in the corresponding amount. The amount that can be trapped in this way is quite large, and a significant reduction in the generation of aggregates and color irregularities is observed.

The time required for the slow cooling process cannot be defined as a fixed time since it could change depending on the volume of the skull melting furnace. However, it can be determined empirically by observing the correlation between the time used in cooling and the generation of the color irregularities in the target. The key finding here is the introduction of the concept of slow cooling and thereby the inhibition of color irregularities, namely, reduction in the segregation amount of oxides can be achieved. Slow cooling, for example, can be performed by step-wise reduction of the output, over the duration of 30 minutes.

The skull ingot obtained by the slow cooling process can then be subjected to machine processing, to remove the oxides that reside at the bottom of the ingot or near the side walls of the skull melting furnace. This significantly reduces the amount of oxides contained in the ingot. The ingot after the machine processing, is further subjected to acid washing, and electron beam (EB) melting, to obtain an ingot called "EB ingot". During this step, volatile ingredients are removed from the skull ingot without introducing new impurities, and a lanthanum ingot that can be subjected to processing for target is thus obtained.

In producing metal lanthanum sputtering target, the sputtering target can be made by cutting the EB ingot into the prescribed size and grinding. A uniform metal lanthanum sputtering target having no segregation of impurities can thus be obtained.

Furthermore, during the electron beam melting, many of the alkali metal elements and alkali earth metal elements, having high vapor pressure, would evaporate by the electron beam melting, thus allowing their efficient removal. Alkali metal elements include lithium, sodium, potassium, rubidium, cesium and francium, while alkali earth metal elements include calcium, strontium, barium and radium. When, for example, the lanthanum is used in electric components, since these elements are electrically positive, the ones having small atomic radius would easily travel within the circuit element and destabilizes the characteristics of the circuit element. The electron beam melting can efficiently remove these.

By forming a film by sputtering using the metal lanthanum sputtering target, a component configuring the lanthanum of metal gate film, and a metal gate film having metal lanthanum as the main component, whose oxygen concentration is 500 wtppm or less, can be provided. Moreover, since there is no segregation due to impurities (oxygen) in the target, the effect of suppressing the generation of particles is achieved. The film on the substrate reflects the composition of the target, thus a lanthanum film having a low oxygen concentration can be formed.

Significantly reducing the amount of oxygen as an impurity is very effective, because a large amount of oxygen would cause so-called splash during the sputtering process due to the presence of oxygen, which hinder the formation of uniform film. In addition, the presence of oxides is not preferable since it becomes the cause for the formation of particles and nodules.

The presence of oxides will have no small effect on the property of the metal gate film as discussed later, thus, it goes without saying that it is necessary to reduce the amount of oxygen as much as possible. Accordingly, strict control of the oxygen levels is required, and in that sense, being able to reduce the oxygen concentration in the lanthanum target of 500 wtppm or less is extremely effective.

The presence of color irregularities of the lanthanum target implies that oxygen content therein as an impurity is high, and that the concentration of oxygen is uneven and variable. As a result of color irregularities in the target, splash which is caused by oxygen would form during the sputtering, and leads to failure in forming uniform film.

In addition, the presence of oxides causes the occurrence of particles and nodules and adversely affects the properties of target in a significant manner.

It is possible to detect the color irregularities by observing the surface of the target. Normally, the occurrence of color irregularities is scored when the area of color irregularities whose sizes are 0.1 mm or larger and which consists 1% or more of the total area. As discussed above, the color irregularities depend heavily on the concentration of oxygen in the lanthanum target, and occur when the oxygen level exceeds 500 wtppm.

Sputtering is employed in many cases where a thin film is formed for use in electronic materials such as gate insulators and thin films for metal gate, which is considered to be a superior method thereof. Thus, producing a metal lanthanum sputtering target using the lanthanum ingot as described is an effective approach.

Target can be produced following the conventional processes including forging, rolling, cutting, finishing (grinding) and the like. There are no particular limitations to the production process and any processes can be arbitrarily selected.

The metal gate film may be used as one having the same composition as the high-purity lanthanum described above, or alternatively, it can also be used as one formed in combination with other gate materials or as alloys or as compounds thereof. This can be accomplished by simultaneous sputtering using target made from other materials or sputtering using a mosaic target. The present invention encompasses all of them. The contents of impurities vary depending on the amounts of impurities contained in the raw materials; however, by using the production method described above, it becomes possible to limit the impurities within the ranges described above.

The present invention provides a high-purity lanthanum, a sputtering target comprising the high-purity lanthanum, and a technique capable of efficiently and stably providing a thin film for a metal gate having the high-purity lanthanum as the main component.

EXAMPLES

Examples and Comparative Examples are now explained with reference to Examples and Comparative Examples. Note that these Examples are merely illustrative and the present invention shall in no way be limited thereby. In other words, various modifications and other embodiments are covered by the present invention, and the present invention is limited only by the scope of its claims.

Example 1

As the lanthanum raw material to be processed, a commercially available product having a purity of 2N to 3N was used. The result of analysis of this lanthanum staring material is shown in table 2. Since Lanthanum is a material that is drawing a lot of attention lately, commercially available products tends to lack consistency in terms of purity as well as quality. The commercially available product used herein is one of such products.

TABLE 2

| element | wtppm |
| --- | --- |
| Li | 1200 |
| Be | 0.02 |
| B | 2.1 |
| F | <5 |
| Na | 4.3 |
| Mg | 33 |
| Al | 120 |
| Si | 160 |
| P | 6.4 |
| Cl | 1.8 |
| K | <0.01 |
| Ca | 0.99 |
| Sc | 0.01 |
| Ti | 5.7 |
| V | 0.28 |
| Cr | 21 |
| Mn | 36 |
| Fe | 330 |

TABLE 2-continued

| element | wtppm |
|---|---|
| Co | 0.32 |
| Ni | 5.1 |
| Cu | 17 |
| Zn | <0.05 |
| Ga | <0.05 |
| Ge | <0.1 |
| As | <0.05 |
| Se | <0.05 |
| Br | <0.05 |
| Rb | <0.01 |
| Sr | 0.02 |
| Y | 1.6 |
| Zr | 0.31 |
| Nb | <0.05 |
| Mo | 20 |
| Ru | <0.05 |
| Rh | <0.05 |
| Pd | <0.05 |
| Ag | <0.01 |
| Cd | <0.05 |
| In | <0.05 |
| Sn | <0.05 |
| Sb | <0.05 |
| Te | <0.05 |
| I | <0.05 |
| Cs | <0.1 |
| Ba | <1 |
| La | |
| Ce | 700 |
| Pr | 37 |
| Nd | 170 |
| Sm | 220 |
| Eu | <0.05 |
| Gd | 3 |
| Tb | 0.15 |
| Dy | 9.6 |
| Ho | 0.07 |
| Er | 0.16 |
| Tm | <0.05 |
| Yb | <0.05 |
| Lu | <0.05 |
| Hf | <0.05 |
| Ta | 15 |
| W | 4.8 |
| Re | <0.05 |
| Os | <0.05 |
| Ir | <0.05 |
| Pt | <0.05 |
| Au | <0.5 |
| Hg | <1 |
| Tl | <0.05 |
| Pb | 0.54 |
| Bi | <0.01 |
| Th | 0.05 |
| U | 0.04 |
| C | 920 |
| N | <10 |
| O | 540 |
| S | <10 |
| H | 26 |

(Molten Salt Electrolysis)

Molten salt electrolysis was performed using the raw material. An apparatus depicted in FIG. 1 above was used in the molten salt electrolysis. The composition of the bath was as follows: 40 kg of potassium chloride (KCl), 9 kg of lithium chloride (LiCl), 6 kg of lanthanum chloride ($LaCl_3$) and 10 kg of La raw material.

The temperature of the electrolytic bath was between 450 to 700° C., and was adjusted to 600° C. in the Examples. The temperature of the bath had no significant effect on the electrolysis. At this temperature, the evaporation of salt was minimal, and no severe contamination of gate valve and cooling tower was observed. An inactive gas was used as the atmosphere.

Figure 2:
FIG. 2 is a figure showing the shape of the crystal that changes depending on the current density during the electrolysis.

Electrolysis was performed at current density of 0.31 $A/cm^2$, and voltage of 1.0 V. The crystal form is shown in FIG. 2. The duration of electrolysis was for 12 hours. Electrodeposited material at 500 g was thus obtained.

Table 3 shows the result of analysis of the deposit obtained by the electrolysis. It shows extremely high concentrations of chloride and oxygen as expected from the result of molten salt electrolysis, but low concentrations for other contaminants.

TABLE 3

| element | wtppm |
|---|---|
| Li | 3.8 |
| Be | <0.01 |
| B | 0.75 |
| F | <5 |
| Na | <0.05 |
| Mg | 1.8 |
| Al | 1.9 |
| Si | 0.55 |
| P | 0.06 |
| Cl | 600 |
| K | 8.2 |
| Ca | 5.2 |
| Sc | <0.005 |
| Ti | 2.6 |
| V | <0.005 |
| Cr | 0.17 |
| Mn | <0.01 |
| Fe | 0.69 |
| Co | <0.01 |
| Ni | 0.28 |
| Cu | <0.05 |
| Zn | <0.05 |
| Ga | <0.05 |
| Ge | <0.1 |
| As | <0.05 |
| Se | <0.05 |
| Br | <0.05 |
| Rb | <0.01 |
| Sr | <0.01 |
| Y | 8.1 |
| Zr | <0.05 |
| Nb | <0.05 |
| Mo | <0.05 |
| Ru | <0.05 |
| Rh | <0.05 |
| Pd | <0.05 |
| Ag | <0.01 |
| Cd | <0.05 |
| In | <0.05 |
| Sn | <0.05 |
| Sb | <0.05 |
| Te | <0.05 |
| I | <0.05 |
| Cs | <0.1 |
| Ba | <1 |
| La | |
| Ce | 23 |
| Pr | 6 |
| Nd | 6.4 |
| Sm | <0.05 |
| Eu | <0.05 |
| Gd | 0.96 |
| Tb | 12 |
| Dy | 0.42 |
| Ho | 0.06 |
| Er | 0.06 |
| Tm | <0.05 |
| Yb | <0.05 |
| Lu | 1 |
| Hf | <0.05 |
| Ta | <5 |
| W | <0.05 |
| Re | <0.05 |
| Os | <0.05 |
| Ir | <0.05 |
| Pt | <0.05 |
| Au | <0.5 |

TABLE 3-continued

| element | wtppm |
|---|---|
| Hg | <0.1 |
| Tl | <0.05 |
| Pb | <0.05 |
| Bi | <0.01 |
| Th | <0.001 |
| U | <0.001 |
| C | 120 |
| N | 90 |
| O | 1200 |
| S | <10 |
| H | 5.9 |

(Desalting Treatment)

The electrodeposited material was vacuum heated using a desalting furnace, and metal and salt were separated by making use of the difference of vapor pressures. The desalting was carried out at the temperature of 850° C., and duration was for 4 hours. The weight of electrodeposited La was reduced about 20% by the desalting. The chloride (Cl) content of La after the desalting treatment was 160 ppm.

(Electron Beam Melting)

Next, the obtained desalted lanthanum was subjected to electron beam melting. This is performed by the extensive irradiation of a low output electron beam to the molten lanthanum raw material in a furnace. The irradiation was performed at the degree of vacuum of $6.0 \times 10^{-5}$ to $7.0 \times 10^{-4}$ mbar, and the melting output of 32 kW. The electron beam melting was repeated twice. The duration of EB melting was 30 minutes each. EB melt ingot was thus produced. High volatile substance was removed by evaporation during the EB melting. The removal of volatile components such as Cl became thus possible.

High-purity lanthanum was thus produced. The result of analysis of the high-purity lanthanum after the electron beam melting is shown in Table 4. As shown in Table 4, the lanthanum had Al<0.5 wtppm, Fe: 0.65 wtppm, and Cu<0.05 wtppm. The values satisfied the requirements for the present invention of 1 wtppm or less.

TABLE 4

| element | wtppm |
|---|---|
| Li | <0.005 |
| Be | <0.01 |
| B | 0.37 |
| F | <5 |
| Na | <0.05 |
| Mg | <0.05 |
| Al | 0.5 |
| Si | 0.42 |
| P | 0.08 |
| Cl | 0.19 |
| K | <0.01 |
| Ca | <0.05 |
| Sc | <0.005 |
| Ti | 0.7 |
| V | <0.005 |
| Cr | <0.05 |
| Mn | <0.01 |
| Fe | 0.65 |
| Co | 0.03 |
| Ni | 0.05 |
| Cu | <0.05 |
| Zn | <0.05 |
| Ga | <0.05 |
| Ge | <0.1 |
| As | <0.05 |
| Se | <0.05 |
| Br | <0.05 |
| Rb | <0.01 |
| Sr | <0.01 |
| Y | 5.3 |
| Zr | <0.05 |
| Nb | <0.05 |
| Mo | <0.05 |
| Ru | <0.05 |
| Rh | <0.05 |
| Pd | <0.05 |
| Ag | <0.01 |
| Cd | <0.05 |
| In | <0.05 |
| Sn | <0.05 |
| Sb | <0.05 |
| Te | <0.05 |
| I | <0.05 |
| Cs | <0.1 |
| Ba | <1 |
| La | |
| Ce | 33 |
| Pr | 7.5 |
| Nd | 7.1 |
| Sm | <0.05 |
| Eu | 0.67 |
| Gd | 1.2 |
| Tb | 9.8 |
| Dy | 0.34 |
| Ho | <0.05 |
| Er | <0.05 |
| Tm | <0.05 |
| Yb | <0.05 |
| Lu | 0.87 |
| Hf | <0.05 |
| Ta | 2.8 |
| W | <0.05 |
| Re | <0.05 |
| Os | <0.05 |
| Ir | <0.05 |
| Pt | <0.05 |
| Au | <0.5 |
| Hg | <0.1 |
| Tl | <0.05 |
| Pb | <0.05 |
| Bi | <0.01 |
| Th | <0.001 |
| U | <0.001 |
| C | 140 |
| N | 50 |
| O | 150 |
| S | <10 |
| H | 22 |

The effect of reducing major impurities was as follows. Li:<0.005 wtppm, Na<0.05 wtppm, K<0.01 wtppm, Ca<0.05 wtppm, Mg<0.05 wtppm, Si: 0.42 wtppm, Ti: 0.7 wtppm, Ni: 0.05 wtppm, Mn<0.01 wtppm, Mo<0.05 wtppm, Ta: 2.8 wtppm, W<0.05 wtppm, U<0.001 wtppm and Th<0.001 wtppm.

In addition, the preferred requirement of the total amount of W, Mo and Ta being 10 wtppm or less of the present invention was also achieved. Likewise, the preferred requirement of U and Th being 1 ppb or less each of the present invention was also achieved. Furthermore, α-ray count of 0.001 cph/cm$^2$ or less was also achieved.

The obtained lanthanum ingot was subjected to a hot press as required, followed by machine processing, and grinding to produce a disc shape target having a dimension of ø140×4 t. The weight of the target was 1.42 kg. This was then joined with a backing plate to form a sputtering target. The target for high-purity lanthanum sputtering having the composition described above was thus obtained. Since the target is highly prone to oxidization, it is preferable to vacuum pack it for storage or transportation.

Comparative Example 1

As the lanthanum raw material to be processed, a commercially available product having a purity of 2N to 3N (see Table 5 below) was used. The commercial lanthanum used in Comparative Example 1 was in tabular form with a dimension of 120 mm square×30 mm t. The weight of one tablet was 2.0 kg to 3.3 kg. Total of 12 such tablets, equivalent to 24 kg of the raw material was used. These tabular lanthanum raw materials were vacuum packed in aluminum since they were highly prone to oxidization.

TABLE 5

| element | wtppm |
| --- | --- |
| Li | 1200 |
| Be | 0.02 |
| B | 2.1 |
| F | <5 |
| Na | 4.3 |
| Mg | 33 |
| Al | 120 |
| Si | 160 |
| P | 6.4 |
| Cl | 1.8 |
| K | <0.01 |
| Ca | 0.99 |
| Sc | 0.01 |
| Ti | 5.7 |
| V | 0.28 |
| Cr | 21 |
| Mn | 36 |
| Fe | 330 |
| Co | 0.32 |
| Ni | 5.1 |
| Cu | 17 |
| Zn | <0.05 |
| Ga | <0.05 |
| Ge | <0.1 |
| As | <0.05 |
| Se | <0.05 |
| Br | <0.05 |
| Rb | <0.01 |
| Sr | 0.02 |
| Y | 1.6 |
| Zr | 0.31 |
| Nb | <0.05 |
| Mo | 20 |
| Ru | <0.05 |
| Rh | <0.05 |
| Pd | <0.05 |
| Ag | <0.01 |
| Cd | <0.05 |
| In | <0.05 |
| Sn | <0.05 |
| Sb | <0.05 |
| Te | <0.05 |
| I | <0.05 |
| Cs | <0.1 |
| Ba | <1 |
| La | |
| Ce | 700 |
| Pr | 37 |
| Nd | 170 |
| Sm | 220 |
| Eu | <0.05 |
| Gd | 3 |
| Tb | 0.15 |
| Dy | 9.6 |
| Ho | 0.07 |
| Er | 0.16 |
| Tm | <0.05 |
| Yb | <0.05 |
| Lu | <0.05 |
| Hf | <0.05 |
| Ta | 15 |
| W | 4.8 |
| Re | <0.05 |

TABLE 5-continued

| element | wtppm |
| --- | --- |
| Os | <0.05 |
| Ir | <0.05 |
| Pt | <0.05 |
| Au | <0.5 |
| Hg | <1 |
| Tl | <0.05 |
| Pb | 0.54 |
| Bi | <0.01 |
| Th | 0.05 |
| U | 0.04 |
| C | 920 |
| N | <10 |
| O | 540 |
| S | <10 |
| H | 26 |

Next, the starting material was melted in an EB melting furnace at the melting output of 32 kW, and an ingot was produced at a molding speed of 13 kg/h. Substances having high volatility were evaporated and removed during the EB melting process. A lanthanum ingot of 22.54 kg having a certain degree of purity was thus produced. The results of analysis of the lanthanum thus obtained are shown in Table 6.

As shown in Table 6, the lanthanum had Al of 72 wtppm, Fe of 130 wtppm and Cu of 92 wtppm. These respective values did not satisfy the requirement of 1 wtppm or less of the present invention. Thus, the goal of the present invention was not achieved merely by subjecting the commercially available La to EB melting.

TABLE 6

| element | wtppm |
| --- | --- |
| Li | 12 |
| Be | <0.01 |
| B | 0.9 |
| F | <5 |
| Na | 0.86 |
| Mg | 2.7 |
| Al | 72 |
| Si | 29 |
| P | 2.6 |
| Cl | 0.31 |
| K | <0.01 |
| Ca | <0.05 |
| Sc | <0.005 |
| Ti | 1.9 |
| V | 0.29 |
| Cr | 4.2 |
| Mn | 6.4 |
| Fe | 130 |
| Co | 0.02 |
| Ni | 6.3 |
| Cu | 9.2 |
| Zn | 0.09 |
| Ga | <0.05 |
| Ge | <0.1 |
| As | 0.82 |
| Se | <0.05 |
| Br | <0.05 |
| Rb | <0.01 |
| Sr | <0.01 |
| Y | 2.2 |
| Zr | 0.22 |
| Nb | <0.05 |
| Mo | 8.2 |
| Ru | <0.05 |
| Rh | <0.05 |
| Pd | <0.05 |
| Ag | <0.01 |
| Cd | <0.05 |
| In | <0.05 |

TABLE 6-continued

| element | wtppm |
|---|---|
| Sn | <0.05 |
| Sb | <0.05 |
| Te | <0.05 |
| I | <0.05 |
| Cs | <0.1 |
| Ba | <1 |
| La | |
| Ce | 410 |
| Pr | 25 |
| Nd | 65 |
| Sm | 36 |
| Eu | <0.05 |
| Gd | 1.5 |
| Tb | 0.09 |
| Dy | 1 |
| Ho | 0.08 |
| Er | 0.18 |
| Tm | <0.05 |
| Yb | 2 |
| Lu | 0.14 |
| Hf | <0.05 |
| Ta | 33 |
| W | 0.81 |
| Re | <0.05 |
| Os | <0.05 |
| Ir | <0.05 |
| Pt | <0.05 |
| Au | <0.5 |
| Hg | <0.1 |
| Tl | <0.05 |
| Pb | 0.24 |
| Bi | <0.01 |
| Th | 0.011 |
| U | 0.0077 |
| C | 1100 |
| N | <10 |
| O | 680 |
| S | 13 |
| H | 23 |

Major impurities included the following; Li: 12 wtppm, Na: 0.86 wtppm, K<0.01 wtppm, Ca<0.05 wtppm, Mg: 2.7 wtppm, Si: 29 wtppm, Ti: 1.9 wtppm, Cr: 4.2 wtppm, Ni: 6.3 wtppm, Mn: 6.4 wtppm, Mo: 8.2 wtppm, Ta: 33 wtppm, W: 0.81 wtppm, U: 0.0077 wtppm and Th: 0.011 wtppm.

Example 2

As the lanthanum raw material to be processed, lanthanum fluoride raw material having a purity of 4N was used. Metal lanthanum is a material that is drawing a lot of attention lately; however, commercially available metal lanthanum has a problem of low purity and inconsistency in terms of quality (see Table 5).

On the other hand, in regard to lanthanum fluoride, it is possible to obtain high-purity product commercially. However, lanthanum fluoride cannot be used as it is. Therefore, being able to efficiently and stably produce high-purity metal lanthanum using the lanthanum fluoride raw material having a purity of 4N becomes essentially important.

Table 7 shows the result of analysis on the lanthanum fluoride raw material. Among the impurities, following elements were included at higher amounts. Na: 0.2 wtppm, Al<0.05 wtppm, Si: 0.94 wtppm, S<10 wtppm, Ca<0.1 wtppm, Fe: 0.14, Cu<0.05 wtppm, and Zn<0.1 wtppm. In regard to rare earth elements, they were included in relatively low amounts as follows. Ce: 1.1 wtppm, Pr<0.1 wtppm, Nd: 0.24 wtppm and Sm: 0.17 wtppm. However, gas components were included at high amounts as follows. C: 180 wtppm, N: 70 wtppm, O: 5200 wtppm and H: 540 wtppm.

TABLE 7

| element | wtppm |
|---|---|
| Li | 0.09 |
| Be | <0.01 |
| B | 0.94 |
| F | |
| Na | 0.2 |
| Mg | 0.94 |
| Al | <0.05 |
| Si | 0.94 |
| P | 2.1 |
| Cl | 12 |
| K | <0.5 |
| Ca | <0.1 |
| Sc | <0.05 |
| Ti | 0.09 |
| V | 0.26 |
| Cr | 0.17 |
| Mn | <0.01 |
| Fe | 0.14 |
| Co | <0.01 |
| Ni | <0.01 |
| Cu | <0.05 |
| Zn | <0.1 |
| Ga | <0.1 |
| Ge | <0.5 |
| As | <0.5 |
| Se | <5 |
| Br | <5 |
| Rb | <5 |
| Sr | <0.05 |
| Y | <0.05 |
| Zr | <0.05 |
| Nb | <0.05 |
| Mo | <0.05 |
| Ru | <0.1 |
| Rh | <0.1 |
| Pd | <0.5 |
| Ag | <0.5 |
| Cd | <1 |
| In | <0.5 |
| Sn | <0.5 |
| Sb | <0.5 |
| Te | <5 |
| I | <1 |
| Cs | <5 |
| Ba | <1 |
| La | |
| Ce | 1.1 |
| Pr | <0.1 |
| Nd | 0.24 |
| Sm | 0.17 |
| Eu | <0.5 |
| Gd | <0.5 |
| Tb | <0.5 |
| Dy | <0.05 |
| Ho | <0.05 |
| Er | <0.05 |
| Tm | <0.05 |
| Yb | <0.05 |
| Lu | <0.05 |
| Hf | <0.05 |
| Ta | <5 |
| W | <0.05 |
| Re | <0.1 |
| Os | <0.05 |
| Ir | <0.1 |
| Pt | <0.5 |
| Au | <1 |
| Hg | <0.5 |
| Tl | <0.1 |
| Pb | <1 |
| Bi | <0.1 |
| Th | <0.005 |
| U | <0.005 |
| C | 180 |
| N | 70 |
| O | 5200 |

TABLE 7-continued

| element | wtppm |
|---|---|
| S | <10 |
| H | 540 |

(Reduction of the Raw Material by Calcium)

The melting crucible used for the reduction was made of tantalum (Ta) and had a dimension of ø 250×H400. Powdery LaF$_3$ and lump Ca, 14.1 kg and 6 kg respectively were mixed and placed inside this tantalum crucible. Ca used as the reducing material was added at an amount about 10% in excess of the calculated amount.

The content of the tantalum crucible placed within a reduction apparatus was slowly heated to 600° C., during which time, the reduction apparatus was evacuated and the content was degassed. Purified Argon gas was then injected to atmospheric pressure of 0.5.

The content was further heated. The reaction was initiated when the temperature of the content reached 800° C. to 1000° C. The reaction formula is $2LaF_3 + 3Ca \rightarrow 2La + 3CaF_2$. Since the reaction is exothermic reaction, it completed rapidly. To improve the separation of purified metal and slag, the temperature was maintained at a temperature around 50° C. higher than the melting point of metal La. Since the melting temperature of La is 921° C., heating was adjusted at a temperature of 971° C., 50° C. higher than 921° C., and maintained.

Metal La was thus obtained. The results of the analysis of the metal La after the reduction by calcium is shown in Table 8.

TABLE 8

| element | wtppm |
|---|---|
| Li | <0.005 |
| Be | <0.01 |
| B | 0.33 |
| F | <5 |
| Na | <0.05 |
| Mg | <0.05 |
| Al | 3.2 |
| Si | 2.1 |
| P | 0.8 |
| Cl | 1.8 |
| K | <0.01 |
| Ca | 24 |
| Sc | <0.005 |
| Ti | 0.9 |
| V | 0.34 |
| Cr | 0.37 |
| Mn | 14 |
| Fe | 3.2 |
| Co | <0.01 |
| Ni | 0.1 |
| Cu | 110 |
| Zn | <0.05 |
| Ga | <0.05 |
| Ge | <0.1 |
| As | <0.05 |
| Se | <0.05 |
| Br | <0.05 |
| Rb | <0.01 |
| Sr | 0.5 |
| Y | 2 |
| Zr | <0.05 |
| Nb | <0.05 |
| Mo | <0.05 |
| Ru | <0.05 |
| Rh | <0.05 |
| Pd | <0.05 |
| Ag | <0.01 |

TABLE 8-continued

| element | wtppm |
|---|---|
| Cd | <0.05 |
| In | <0.05 |
| Sn | <0.05 |
| Sb | <0.05 |
| Te | <0.05 |
| I | <0.05 |
| Cs | <0.1 |
| Ba | <1 |
| La | |
| Ce | 2.4 |
| Pr | 0.16 |
| Nd | 0.64 |
| Sm | <0.05 |
| Eu | <0.05 |
| Gd | <0.05 |
| Tb | <0.05 |
| Dy | <0.05 |
| Ho | <0.05 |
| Er | <0.05 |
| Tm | <0.05 |
| Yb | <0.05 |
| Lu | <0.05 |
| Hf | <0.05 |
| Ta | <5 |
| W | <0.05 |
| Re | <0.05 |
| Os | <0.05 |
| Ir | <0.05 |
| Pt | <0.05 |
| Au | <0.5 |
| Hg | <0.1 |
| Tl | <0.05 |
| Pb | 0.6 |
| Bi | <0.01 |
| Th | <0.005 |
| U | <0.005 |
| C | 320 |
| N | 85 |
| O | 450 |
| S | <10 |
| H | 22 |

As table 8 shows, the following was observed. Al: 3.2 wtppm, Si: 2.1 wtppm, Ca: 24 wtppm, Fe: 3.2 wtppm, Cu: 110 wtppm, Mo<0.05 wtppm, Ta<5 wtppm, W<0.05 wtppm, C: 320 wtppm, N: 85 wtppm, O: 450 wtppm, S<10 wtppm, and H: 22 wtppm. There remained a problem that the content of Ca was high though it was caused by reduction by Ca. In addition, because Cu content in Ca was high, the Cu content in La also became high.

(Molten Salt Electrolysis)

Molten salt electrolysis was performed using the raw material. An apparatus depicted in FIG. 1 above was used in the molten salt electrolysis. As to the composition of the bath, 40 kg of potassium chloride (KCl), 9 kg of lithium chloride (LiCl), 6 kg of lanthanum chloride (LaCl$_3$) and 10 kg of La raw material were used.

The temperature of the electrolytic bath was between 450 to 700° C., and was adjusted to 600° C. in the Examples. The temperature of the bath had no significant effect on the electrolysis. In addition, at this temperature, the evaporation of salt was minimal, and no severe contamination of gate valve and cooling tower was observed. Argon gas was injected as the atmosphere.

Electrolysis was performed at current density of 0.13 A/cm$^2$, and voltage of 0.5 V. The duration of electrolysis was for 12 hours. Electrodeposited material at 250 g was obtained. The deposited material was similar to that depicted in FIG. 2.

Table 9 shows the result of analysis of the deposit obtained by the electrolysis. It shows extremely high concentration of chloride and oxygen as expected for the result of molten salt electrolysis, but low concentration for other contaminants.

TABLE 9

| element | wtppm |
|---|---|
| Li | 14 |
| Be | <0.01 |
| B | 0.04 |
| F | <5 |
| Na | <0.05 |
| Mg | <0.05 |
| Al | 0.09 |
| Si | 0.38 |
| P | 0.16 |
| Cl | ~550 |
| K | 16 |
| Ca | 22 |
| Sc | <0.005 |
| Ti | 0.53 |
| V | 0.07 |
| Cr | <0.05 |
| Mn | <0.01 |
| Fe | 0.5 |
| Co | 0.34 |
| Ni | 0.27 |
| Cu | 0.44 |
| Zn | <0.05 |
| Ga | <0.05 |
| Ge | <0.1 |
| As | <0.05 |
| Se | <0.05 |
| Br | <0.05 |
| Rb | <0.01 |
| Sr | <0.01 |
| Y | 0.61 |
| Zr | 0.02 |
| Nb | 0.35 |
| Mo | <0.05 |
| Ru | 0.13 |
| Rh | <0.05 |
| Pd | <0.05 |
| Ag | <0.01 |
| Cd | <0.05 |
| In | <0.05 |
| Sn | <0.05 |
| Sb | <0.05 |
| Te | <0.05 |
| I | <0.05 |
| Cs | <0.1 |
| Ba | <1 |
| La | |
| Ce | 24 |
| Pr | 1.8 |
| Nd | 2 |
| Sm | <0.05 |
| Eu | <0.05 |
| Gd | 19 |
| Tb | 3.3 |
| Dy | <0.05 |
| Ho | <0.05 |
| Er | 0.09 |
| Tm | <0.05 |
| Yb | <0.05 |
| Lu | <0.05 |
| Hf | <0.05 |
| Ta | 3.5 |
| W | 0.25 |
| Re | <0.05 |
| Os | <0.05 |
| Ir | <0.05 |
| Pt | <0.05 |
| Au | <0.5 |
| Hg | <0.1 |
| Tl | <0.05 |
| Pb | 0.04 |
| Bi | <0.01 |
| Th | <0.001 |
| U | <0.001 |
| C | 130 |

TABLE 9-continued

| element | wtppm |
|---|---|
| N | 35 |
| O | 9400 |
| S | <10 |
| H | 420 |

(Desalting Treatment)

The electrodeposited material was vacuum heated using a desalting furnace, and metal and salt were separated by making use of the difference of vapor pressure. The desalting was carried out at the temperature of 850° C., and duration was for 4 hours. The weight of electrodeposited La was reduced about 20% by the desalting. The chloride (Cl) content of La after the desalting treatment was 160 ppm.

(Electron Beam Melting)

Next, the obtained desalting treated lanthanum was subjected to electron beam melting. This is performed by the extensive irradiation of a low output electron beam to the molten lanthanum raw material in a furnace. The irradiation was performed at the degree of vacuum of $6.0 \times 10^{-5}$ to $7.0 \times 10^{-4}$ mbar, and the melting output of 32 kW. The electron beam melting was repeated twice. The duration of EB melting was 30 minutes each. EB melt ingot was thus produced. It thus became possible to evaporate and remove high volatile substances during the EB melting.

High-purity lanthanum was thus produced. The result of the analysis of the high-purity lanthanum after the electron beam melting is shown in Table 10. As Table 10 shows, Li<0.005 wtppm, Na<0.05 wtppm, Al<0.05 wtppm, Si: 0.21 wtppm, S: 2.1 wtppm, Ca<0.05 wtppm, Fe: 0.18 wtppm, Cu: 0.12 wtppm, Zn<0.05 wtppm, Mo<0.05 wtppm, Ta: 2.5 wtppm, W: 0.05 wtppm, C: 140 wtppm, N<10 wtppm, O: 290 wtppm, S<10 wtppm, H: 3.2 wtppm were achieved. The values satisfied the requirements for the present invention. And, oxygen and Ca that were resistant to reduction during the reduction with calcium were also significantly reduced.

TABLE 10

| element | wtppm |
|---|---|
| Li | <0.005 |
| Be | <0.01 |
| B | <0.01 |
| F | <5 |
| Na | <0.05 |
| Mg | <0.05 |
| Al | <0.05 |
| Si | 0.21 |
| P | 0.03 |
| Cl | 490 |
| K | <0.01 |
| Ca | <0.05 |
| Sc | <0.005 |
| Ti | 0.97 |
| V | <0.005 |
| Cr | <0.05 |
| Mn | <0.01 |
| Fe | 0.18 |
| Co | 0.03 |
| Ni | 0.47 |
| Cu | 0.12 |
| Zn | <0.05 |
| Ga | <0.05 |
| Ge | <0.1 |
| As | =<5 |
| Se | <0.05 |
| Br | <0.05 |
| Rb | <0.01 |
| Sr | <0.01 |

TABLE 10-continued

| element | wtppm |
|---|---|
| Y | 1.5 |
| Zr | <0.01 |
| Nb | <0.05 |
| Mo | <0.05 |
| Ru | <0.05 |
| Rh | <0.05 |
| Pd | <0.05 |
| Ag | <0.01 |
| Cd | <0.05 |
| In | <0.05 |
| Sn | <0.05 |
| Sb | <0.05 |
| Te | <0.05 |
| I | <0.05 |
| Cs | <0.1 |
| Ba | <1 |
| La | |
| Ce | 17 |
| Pr | 3 |
| Nd | 8.2 |
| Sm | <0.05 |
| Eu | 0.29 |
| Gd | 0.71 |
| Tb | 3.4 |
| Dy | 0.13 |
| Ho | 0.53 |
| Er | 0.06 |
| Tm | <0.05 |
| Yb | <0.05 |
| Lu | <0.05 |
| Hf | <0.05 |
| Ta | 2.5 |
| W | 0.05 |
| Re | <0.05 |
| Os | <0.05 |
| Ir | <0.05 |
| Pt | <0.05 |
| Au | <0.5 |
| Hg | <0.1 |
| Tl | <0.05 |
| Pb | 0.04 |
| Bi | <0.01 |
| Th | <0.001 |
| U | <0.001 |
| C | 140 |
| N | <10 |
| O | 290 |
| S | <10 |
| H | 3.2 |

The obtained lanthanum ingot was subjected to a hot press as required, followed by machine processing, and grinding to produce a disc shape target having a dimension of ø140×14 t. The weight of the target was 1.42 kg. This was then joined with a backing plate to form a sputtering target. The target for high-purity lanthanum sputtering having the composition described above was thus obtained. Since the target is highly prone to oxidization, it is preferable to vacuum pack it for storage or transportation.

Comparative Example 2

The comparative example 2 is the same as the Example 2 in terms of conditions, except for skipping the electrolysis step. As the lanthanum raw material to be processed, a commercially available product having a purity of 2N5 to 3N shown in Table 5 above was used, as in Example 2. The commercially available lanthanum used in the present Comparative Example 2 was in tabular form with a dimension of 120 mm square×30 mm t. The weight of one tablet was 2.0 kg to 3.3 kg. Total of 12 such tablets, equivalent to 24 kg of the raw material was used. These tabular lanthanum raw materials were vacuum packed in aluminum since they were highly prone to oxidization.

The major impurities shown in Table 5 includes; Li: 1200 wtppm, Na: 4.3 wtppm, Mg: 33 wtppm, Al: 120 wtppm, Si: 160 wtppm, S: 50 wtppm, Ti: 5.7 wtppm, Cr: 21 wtppm, Mn: 36 wtppm, Fe: 330 wtppm, Co: 0.32 wtppm, Ni: 5.1 wtppm, Cu: 17 wtppm, Zr: 0.31 wtppm, C: 920 wtppm, N<10 wtppm, O: 540 wtppm, S<10 wtppm and H: 26 wtppm.

Next, using a large, 400 kW EB melting furnace, an ingot was produced at the degree of vacuum of $7.0 \times 10^{-5}$ to $3.5 \times 10^{-5}$ mbar, the melting output of 96 kW, and a molding speed of 13 kg/h. High volatile substances were evaporated and removed during the EB melting. As mentioned earlier, the molten salt electrolysis was not performed prior to the EB melting. High-purity lanthanum ingot of 22.54 kg was thus produced. The results of the analysis of the high-purity lanthanum thus obtained are shown in Table 11.

As shown in Table 11, the major impurities in the lanthanum after the electron beam melting were as follows. Li<0.005 wtppm, Na<0.05 wtppm, Mg<0.05 wtppm, Al: 4.2 wtppm, Si: 11 wtppm, S: 9 wtppm, Ti: 1.8 wtppm, Cr: 0.36 wtppm, Mn: 1.7 wtppm, Fe: 6.5 wtppm, Cu: 98 wtppm, C: 450 wtppm, N: 140 wtppm, O: 900 wtppm and H: 23 wtppm.

As can be seen above, the reduction of Al, Fe and Cu was not achieved and the reduction of gas components was also not sufficient. Overall, the amounts of impurities were higher than the Examples above, and the goal of the present invention was not achieved.

TABLE 11

| element | wtppm |
|---|---|
| Li | <0.005 |
| Be | <0.01 |
| B | 0.68 |
| F | <5 |
| Na | <0.05 |
| Mg | <0.05 |
| Al | 4.2 |
| Si | 11 |
| P | 0.65 |
| Cl | 0.14 |
| K | <0.01 |
| Ca | <1.4 |
| Sc | <0.005 |
| Ti | 1.8 |
| V | 0.77 |
| Cr | 0.36 |
| Mn | 1.7 |
| Fe | 6.5 |
| Co | <0.01 |
| Ni | 0.2 |
| Cu | 98 |
| Zn | <0.05 |
| Ga | <0.05 |
| Ge | <0.1 |
| As | <0.05 |
| Se | <0.05 |
| Br | <0.05 |
| Rb | <0.01 |
| Sr | <0.01 |
| Y | 1.5 |
| Zr | <0.05 |
| Nb | <0.05 |
| Mo | <0.05 |
| Ru | <0.05 |
| Rh | <0.05 |
| Pd | <0.05 |
| Ag | <0.01 |
| Cd | <0.05 |
| In | <0.05 |
| Sn | <0.05 |
| Sb | <0.05 |
| Te | <0.05 |
| I | <0.05 |
| Cs | <0.1 |

TABLE 11-continued

| element | wtppm |
|---|---|
| Ba | <1 |
| La | |
| Ce | 3.1 |
| Pr | 0.08 |
| Nd | 0.55 |
| Sm | <0.05 |
| Eu | <0.05 |
| Gd | <0.05 |
| Tb | <0.05 |
| Dy | <0.05 |
| Ho | <0.05 |
| Er | <0.05 |
| Tm | <0.05 |
| Yb | <0.05 |
| Lu | <0.05 |
| Hf | <0.05 |
| Ta | <5 |
| W | <0.05 |
| Re | <0.05 |
| Os | <0.05 |
| Ir | <0.05 |
| Pt | <0.05 |
| Au | <0.5 |
| Hg | <0.1 |
| Tl | <0.05 |
| Pb | 0.6 |
| Bi | <0.01 |
| Th | <0.005 |
| U | <0.005 |
| C | 450 |
| N | 140 |
| O | 900 |
| S | <10 |
| H | 23 |

Example 3

Next, a specific example for reducing the amount of oxygen is explained. As the lanthanum raw material to be processed, a commercially available product having a purity of 2N to 3N was used. The result of analysis of this lanthanum raw material is shown in Table 12. Lanthanum is a material that is drawing a lot of attention lately; however, commercially available raw material lacks consistency in terms of purity and quality. The commercially available raw material is one of such products.

TABLE 12

| element | wtppm |
|---|---|
| Li | 15 |
| Be | <0.01 |
| B | 1.8 |
| F | <5 |
| Na | <0.05 |
| Mg | <0.05 |
| Al | 78 |
| Si | 240 |
| P | 5.4 |
| Cl | 2.8 |
| K | <0.05 |
| Ca | <0.05 |
| Sc | 0.009 |
| Ti | 1.9 |
| V | 0.13 |
| Cr | 13 |
| Mn | 0.22 |
| Fe | 380 |
| Co | 0.08 |
| Ni | 1.3 |
| Cu | 7.5 |
| Zn | <0.05 |

TABLE 12-continued

| element | wtppm |
|---|---|
| Ga | <0.05 |
| Ge | <0.1 |
| As | <0.05 |
| Se | <0.05 |
| Br | <0.05 |
| Rb | <0.01 |
| Sr | <0.01 |
| Y | 1.8 |
| Zr | 0.12 |
| Nb | <0.05 |
| Mo | 16 |
| Ru | <0.05 |
| Rh | <0.05 |
| Pd | <0.05 |
| Ag | <0.01 |
| Cd | <0.05 |
| In | <0.05 |
| Sn | <0.05 |
| Sb | <0.05 |
| Te | <0.05 |
| I | <0.05 |
| Cs | <0.1 |
| Ba | <1 |
| La | |
| Ce | 420 |
| Pr | 28 |
| Nd | 100 |
| Sm | 50 |
| Eu | 0.92 |
| Gd | 3.6 |
| Tb | 0.17 |
| Dy | 0.62 |
| Ho | 0.07 |
| Er | 0.18 |
| Tm | <0.05 |
| Yb | <0.05 |
| Lu | <0.05 |
| Hf | <0.05 |
| Ta | 9 |
| W | 0.95 |
| Re | <0.05 |
| Os | <0.05 |
| Ir | <0.05 |
| Pt | <0.05 |
| Au | <0.5 |
| Hg | <0.1 |
| Tl | <0.05 |
| Pb | 0.34 |
| Bi | <0.01 |
| Th | 0.04 |
| U | 0.04 |
| C | 370 |
| N | <10 |
| O | 660 |
| S | <10 |
| H | 5.9 |

(Skull Melting)

For skull melting, a water-cooled copper crucible having a dimension of ø 80×H70 was used, to which 2 kg of lanthanum (La) was charged. Lanthanum in this case was dissolved at an output of 100 kW. After confirming that the entire amount of lanthanum had dissolved through an observation window, the output was held steady for an additional 30 minutes, after which it was reduced in a stepwise fashion, so that the output was 75 kW after 5 minutes, 50 kW after 10 minutes, 25 kW after 15 minutes, 12.5 kW after 20 minutes, 7 kW after 25 minutes. The output was then held steady for final 30 minutes after which it was completely turned off.

In regard to this slow cooling process, larger crucibles would allow more detailed control. On the other hand, the use of too small crucible would make it difficult to fine-control the slow cooling process. Therefore, adjusting the size of furnace depending on the amount of the lanthanum charged becomes necessary. Following the above steps, it became possible to segregate oxides and to remove oxides at the bottom of the ingot.
(Machine Processing)

The oxides residing at the bottom of the skull ingot were removed.
(Electron Beam Melting)

Next, the obtained skull ingot was washed with acid and subjected to electron beam melting. This is performed by the extensive irradiation of a low output electron beam to the molten lanthanum raw material in a furnace. The irradiation was performed at the degree of vacuum of $6.0 \times 10^{-5}$ to $7.0 \times 10^{-4}$ mbar, and the melting output of 32 kW. The electron beam melting was repeated twice. The duration of EB melting was 30 minutes each. EB ingot was thus produced. High volatile substance was removed by evaporation during the EB melting.

The obtained EB ingot was subjected to a hot press as required, followed by machine processing, and grinding to produce a disc shape target having a dimension of ø140×14 t. The weight of the target was 1.42 kg. This was then joined with a backing plate to form a sputtering target. The target for high-purity lanthanum sputtering having the composition described above was thus obtained. Since the target is highly prone to oxidization, it is preferable to vacuum pack it for storage or transportation.

From the EB ingot thus produced, four 10 mm square samples were cut out, and the oxygen concentrations of each were measured and averaged to define the oxygen concentration of the EB ingot. As a result, the oxygen concentration was on average 280 wtppm. Thus, the condition of the present invention was achieved.

Similarly, same analysis on 10 EB ingots revealed the oxygen concentration of 280 wtppm, a level that is identical to that of Example 3. Table 13 shows the result of an analysis of the lanthanum obtained by the above process.

TABLE 13

| element | wtppm |
| --- | --- |
| Li | <0.01 |
| Be | <0.01 |
| B | 1.9 |
| F | <5 |
| Na | 0.07 |
| Mg | <0.05 |
| Al | 75 |
| Si | 280 |
| P | 4.9 |
| Cl | 3.4 |
| K | <0.01 |
| Ca | <0.05 |
| Sc | 0.008 |
| Ti | 4.8 |
| V | 0.22 |
| Cr | 10 |
| Mn | 0.23 |
| Fe | 270 |
| Co | 0.12 |
| Ni | 1.6 |
| Cu | 21 |
| Zn | <0.05 |
| Ga | <0.05 |
| Ge | <0.1 |
| As | <0.05 |
| Se | <0.05 |
| Br | <0.05 |
| Rb | <0.01 |
| Sr | <0.01 |
| Y | 1.7 |
| Zr | 0.27 |
| Nb | <0.05 |

TABLE 13-continued

| element | wtppm |
| --- | --- |
| Mo | 25 |
| Ru | <0.05 |
| Rh | <0.05 |
| Pd | <0.05 |
| Ag | <0.01 |
| Cd | <0.05 |
| In | <0.05 |
| Sn | <0.05 |
| Sb | <0.05 |
| Te | <0.05 |
| I | <0.05 |
| Cs | <0.1 |
| Ba | <1 |
| La | |
| Ce | 410 |
| Pr | 27 |
| Nd | 98 |
| Sm | 110 |
| Eu | 0.57 |
| Gd | 2.5 |
| Tb | 0.13 |
| Dy | 0.49 |
| Ho | <0.05 |
| Er | 0.17 |
| Tm | <0.05 |
| Yb | <0.05 |
| Lu | <0.05 |
| Hf | <0.05 |
| Ta | 15 |
| W | 1.9 |
| Re | <0.05 |
| Os | <0.05 |
| Ir | <0.05 |
| Pt | <0.05 |
| Au | <0.5 |
| Hg | <0.1 |
| Tl | <0.05 |
| Pb | 0.25 |
| Bi | <0.01 |
| Th | 0.04 |
| U | 0.03 |
| C | 160 |
| N | <10 |
| O | 280 |
| S | <10 |
| H | 16 |

(Regarding the Color Irregularities of Target in this Example)

As discussed above, when the content of oxygen as an impurity is high, color irregularities in target occurs. Especially, color irregularities tend to occur when the oxygen content is uneven and variable. As a result of color irregularities in the target, splash which is caused by oxygen would form during the sputtering, and leads to failure in forming uniform film.

In addition, when this occurs, the amount of oxides naturally becomes high, leading to the occurrence of particles and nodules. Machine processing that removes the oxides that resides at the bottom of the skull ingot is thus effective, and in this Example, observation of the surface of the target did not reveal any color irregularities.

Comparative Example 3

This comparative Example 3 is identical to Example 3 except for skipping the grinding step. As the lanthanum raw material to be processed, a commercially available product having a purity of 2N to 3N was used as in Example 1. Lanthanum is a material that is drawing a lot of attention lately; however, commercially available raw material lacks consistency in terms of purity and quality. The commercially available raw material is one of such products.

(Electron Beam Melting)

Next, the commercially available lanthanum raw material (lanthanum ingot) was washed with acid and EB ingot was produced using an EB melting furnace at the degree of vacuum of $7.0 \times 10^{-5}$ to $3.5 \times 10^{-5}$ mbar, and the melting output of 32 kW, and the molding speed of 45 kg/h.

The obtained EB ingot was subjected to a hot press as required, followed by machine processing, and grinding to produce a disc shape target having a dimension of ø140×14 t. The weight of the target was 1.42 kg. This was then joined with a backing plate to form a sputtering target.

From the EB ingot thus produced, four 10 mm square samples were cut out, and the oxygen concentrations of each were measured and averaged to define the oxygen concentration of the EB ingot.

As a result, the oxygen concentration was on average 820 wtppm. Observation of the color irregularities revealed the occurrence of color irregularities as shown in FIG. 4.

Similarly, same analysis on 10 EB ingots revealed the oxygen concentration of 560 wtppm, as shown in Table 14, a level that is similar to that of Comparative Example 1.

The purpose of Comparative Example 3 is to compare it with Example 3, and it is obviously not intended to reject the features other than the differing point of machine processing step removing the oxides residing at the bottom of the skull ingot.

TABLE 14

| element | wtppm |
| --- | --- |
| Li | <0.01 |
| Be | <0.01 |
| B | 2 |
| F | <5 |
| Na | <0.05 |
| Mg | <0.05 |
| Al | 87 |
| Si | 150 |
| P | 4.4 |
| Cl | 2.4 |
| K | <0.01 |
| Ca | <0.05 |
| Sc | 0.01 |
| Ti | 3.4 |
| V | 0.11 |
| Cr | 16 |
| Mn | 0.18 |
| Fe | 350 |
| Co | 0.09 |
| Ni | 3.1 |
| Cu | 31 |
| Zn | <0.05 |
| Ga | <0.05 |
| Ge | <0.1 |
| As | <0.05 |
| Se | <0.05 |
| Br | <0.05 |
| Rb | <0.01 |
| Sr | <0.01 |
| Y | 2.1 |
| Zr | 0.17 |
| Nb | <0.05 |
| Mo | 22 |
| Ru | <0.05 |
| Rh | <0.05 |
| Pd | <0.05 |
| Ag | <0.01 |
| Cd | <0.05 |
| In | <0.05 |
| Sn | <0.05 |
| Sb | <0.05 |
| Te | <0.05 |
| I | <0.05 |
| Cs | <0.1 |
| Ba | <1 |
| La | |
| Ce | 690 |
| Pr | 33 |
| Nd | 140 |
| Sm | 80 |
| Eu | 0.6 |
| Gd | 3.1 |
| Tb | 0.22 |
| Dy | <0.05 |
| Ho | <0.05 |
| Er | <0.05 |
| Tm | <0.05 |
| Yb | <0.05 |
| Lu | <0.05 |
| Hf | <0.05 |
| Ta | 20 |
| W | 1.4 |
| Re | <0.05 |
| Os | <0.05 |
| Ir | <0.05 |
| Pt | <0.05 |
| Au | <0.5 |
| Hg | <0.1 |
| Tl | <0.05 |
| Pb | 0.08 |
| Bi | <0.01 |
| Th | 0.02 |
| U | 0.04 |
| C | 280 |
| N | <10 |
| O | 560 |
| S | <10 |
| H | 9.5 |

Example 4

As the lanthanum raw material to be processed, lanthanum fluoride raw material having a purity of 4N was used. Metal lanthanum is a material that is drawing a lot of attention lately; however, commercially available metal lanthanum has a problem of low purity and inconsistency in terms of quality (see Table 5).

On the other hand, in regard to lanthanum fluoride, it is possible to obtain high-purity product commercially. However, lanthanum fluoride cannot be used as it is. Therefore, being able to efficiently and stably produce high-purity metal lanthanum using the lanthanum fluoride starting material having a purity of 4N becomes essentially important.

The result of an analysis of lanthanum fluoride starting material is shown in Table 7. Major impurities contained therein include the following elements. Na: 0.2 wtppm, Al<0.05 wtppm, Si: 0.94 wtppm, S<10 wtppm, Ca<0.1 wtppm, Fe: 0.14 wtppm, Cu<0.05 wtppm, and Zn<0.1 wtppm. On the other hand, the contents of rare earth elements are relatively low as follows; Ce: 1.1 wtppm, Pr<0.1 wtppm, Nd: 0.24 wtppm, and Sm: 0.17 wtppm. However, contents of gas components were high as follows; C: 180 wtppm, N: 70 wtppm, O: 5200 wtppm and H: 540 wtppm.

(Reduction of the Raw Material by Calcium)

The melting crucible used for the reduction was made of tantalum (Ta) and had a dimension of ø 250×H400. Powdery $LaF_3$ and lump Ca, 14.1 kg and 6 kg respectively were mixed and placed inside this tantalum crucible. Ca used as the reducing material was added at an amount about 10% in excess of the calculated amount. Here, the distilled calcium shown in paragraphs 0052 and 0053 was used.

The content of the tantalum crucible placed within a reduction apparatus was slowly heated to 600° C., during which time, the reduction apparatus was evacuated and the content was degassed. Purified Argon gas was then injected to atmospheric pressure of 0.5.

The content was further heated. The reaction initiated when the temperature of the content reached 800° C. to 1000° C. The reaction formula is $2LaF_3+3Ca \rightarrow 2La+3CaF_2$. Since the reaction is exothermic reaction, it completed rapidly. To improve the separation of purified metal and slag, the temperature was maintained at a temperature 50° C. higher than the melting point of metal La. Since the melting temperature of La is 921° C., heating was adjusted at a temperature of 971° C., 50° C. higher than 921° C., and maintained.

Metal La was thus obtained. The results of the analysis of the metal La after the reduction by calcium is shown in Table 8.

As table 8 shows, the following was observed. Al: 3.2 wtppm, Si: 2.1 wtppm, Ca: 24 wtppm, Fe: 3.2 wtppm, Cu: 110 wtppm, Mo<0.05 wtppm, Ta<5 wtppm, W<0.05 wtppm, C: 320 wtppm, N: 85 wtppm, O: 450 wtppm, S<10 wtppm, and H: 22 wtppm. There remained a problem that the content of Ca was high though it was caused by reduction by Ca.

(Molten Salt Electrolysis)

Molten salt electrolysis was performed using the raw material. An apparatus depicted in FIG. 1 above was used in the molten salt electrolysis. As to the composition of the bath, 40 kg of potassium chloride (KCl), 9 kg of lithium chloride (LiCl), 6 kg of lanthanum chloride ($LaCl_3$) and 10 kg of La raw material were used.

The temperature of the electrolytic bath was between 450 to 700° C., and was adjusted to 600° C. in the Examples. The temperature of the bath had no significant effect on the electrolysis. In addition, at this temperature, the evaporation of salt was minimal, and no severe contamination of gate valve and cooling tower was observed. Argon gas was injected as the atmosphere.

Electrolysis was performed at current density of 0.43 A/cm$^2$, and voltage of 1.0 V. The duration of electrolysis was for 12 hours. Electrodeposited material 280 g was obtained.

The table 9 shows the result of analysis of the deposit obtained by the electrolysis. It shows extremely high concentration of chloride and oxygen as expected for the result of molten salt electrolysis, but low concentrations for other contaminants.

(Desalting Treatment)

The electrodeposited material was vacuum heated using a desalting furnace, and metal and salt were separated by making use of the difference of vapor pressures. The desalting was carried out at the temperature of 850° C., and duration was for 100 hours. The weight of electrodeposited La was reduced about 20% by the desalting. The chloride (Cl) content of La after the desalting treatment was 160 ppm.

(Skull Melting)

For skull melting, a water-cooled copper crucible having a dimension of ø 80×H70 was used, to which 2 kg of lanthanum (La) was charged. Lanthanum in this case was dissolved at an output of 100 kW. After confirming that the entire amount of lanthanum had dissolved through an observation window, the output was held steady for an additional 30 minutes, after which it was reduced in a stepwise fashion, so that the output was 75 kW after 5 minutes, 50 kW after 10 minutes, 25 kW after 15 minutes, 12.5 kW after 20 minutes, 7 kW after 25 minutes. The output was then held steady for final 30 minutes, and then was turned off.

In regard to this slow cooling process, larger crucibles would allow more detailed control. On the other hand, the use of too small crucible would make it difficult to fine-control the slow cooling process. Therefore, adjusting the size of furnace depending on the amount of the lanthanum charged becomes necessary. Following the above steps, it became possible to segregate oxides and to remove oxides at the bottom of the ingot. The result of analysis on the deposited material obtained by the electrolysis is shown in Table 15.

Table 15 shows the major impurities contained therein, including; Li: 16 wtppm, Mg: 0.94 wtppm, S<10 wtppm, Cl: 49 wtppm, Fe: 0.12 wtppm, Co: 0.02 wtppm, Ni: 0.5 wtppm, Cu: 0.23 wtppm, Ce: 5.2 wtppm, C: 150 wtppm and O: 340 wtppm.

TABLE 15

| element | wtppm |
|---------|-------|
| Li | 16 |
| Be | <0.01 |
| B | <0.01 |
| F | <5 |
| Na | <0.05 |
| Mg | 0.94 |
| Al | <0.05 |
| Si | 0.09 |
| P | <0.01 |
| Cl | 49 |
| K | 0.55 |
| Ca | <0.05 |
| Sc | <0.005 |
| Ti | <0.005 |
| V | <0.005 |
| Cr | <0.05 |
| Mn | 0.04 |
| Fe | 0.12 |
| Co | 0.02 |
| Ni | 0.5 |
| Cu | 0.23 |
| Zn | <0.05 |
| Ga | <0.05 |
| Ge | <0.1 |
| As | <1 |
| Se | <0.05 |
| Br | <0.05 |
| Rb | <0.01 |
| Sr | <0.01 |
| Y | <0.05 |
| Zr | <0.01 |
| Nb | <0.05 |
| Mo | <0.05 |
| Ru | <0.05 |
| Rh | <0.05 |
| Pd | <0.05 |
| Ag | <0.1 |
| Cd | <0.05 |
| In | <0.05 |
| Sn | <0.05 |
| Sb | <0.05 |
| Te | <0.05 |
| I | <0.05 |
| Cs | <0.1 |
| Ba | <1 |
| La | |
| Ce | 5.2 |
| Pr | 0.53 |
| Nd | 0.8 |
| Sm | <0.05 |
| Eu | <0.05 |
| Gd | <0.05 |
| Tb | <0.05 |
| Dy | <0.05 |
| Ho | <0.05 |
| Er | <0.05 |
| Tm | <0.05 |
| Yb | <0.05 |
| Lu | <0.05 |
| Hf | <0.05 |
| Ta | <5 |
| W | <0.05 |
| Re | <0.05 |
| Os | <0.05 |

TABLE 15-continued

| element | wtppm |
|---|---|
| Ir | <0.05 |
| Pt | <0.05 |
| Au | <0.5 |
| Hg | <0.1 |
| Tl | <0.05 |
| Pb | <0.01 |
| Bi | <0.01 |
| Th | <0.001 |
| U | <0.001 |
| C | 150 |
| N | <10 |
| O | 340 |
| S | <10 |
| H | 11 |

(Machine Processing)

The oxides residing at the bottom of the skull ingot were removed.

(Electron Beam Melting)

Next, the obtained molded lanthanum was subjected to electron beam melting. This is performed by the extensive irradiation of a low output electron beam to the molten lanthanum raw material in a furnace. The irradiation was performed at the degree of vacuum of $6.0 \times 10^{-5}$ to $7.0 \times 10^{-4}$ mbar, and the melting output of 32 kW. The electron beam melting was repeated twice. The duration of EB melting was 30 minutes each. EB melt ingot was thus produced. High volatile substance was removed by evaporation during the EB melting.

A high-purity lanthanum was thus produced. The result of analysis of the high-purity lanthanum after the electron beam melting is shown in Table 16.

As can be seen in Table 16, the following was observed. Li<0.005 wtppm, Na<0.05 wtppm, Al: 0.39 wtppm, Si: 0.25 wtppm, S: 0.6 wtppm, Ca<0.05 wtppm, Fe: 0.43 wtppm, Cu: 0.34 wtppm, Zn<0.05 wtppm, Mo<0.05 wtppm, Ta<5 wtppm, W<0.05 wtppm, C: 140 wtppm, N<10 wtppm, O: 290 wtppm, S<10 wtppm and H, 2.9 wtppm. The use of high-purity lanthanum fluoride improved the purity, and the conditions for the present invention were all satisfied. And, the contents of oxygen and Ca, that were resistant to reduction during the reduction by Ca, were significantly reduced.

TABLE 16

| element | wtppm |
|---|---|
| Li | <0.005 |
| Be | <0.01 |
| B | <0.01 |
| F | <5 |
| Na | <0.05 |
| Mg | <0.05 |
| Al | 0.39 |
| Si | 0.25 |
| P | <0.01 |
| Cl | 9 |
| K | <0.01 |
| Ca | <0.05 |
| Sc | <0.005 |
| Ti | 0.03 |
| V | <0.005 |
| Cr | <0.05 |
| Mn | <0.01 |
| Fe | 0.43 |
| Co | <0.01 |
| Ni | 0.21 |
| Cu | 0.34 |
| Zn | <0.05 |
| Ga | <0.05 |
| Ge | <0.1 |
| As | <0.1 |
| Se | <0.05 |
| Br | <0.05 |
| Rb | <0.01 |
| Sr | <0.01 |
| Y | <0.05 |
| Zr | <0.01 |
| Nb | <0.05 |
| Mo | <0.05 |
| Ru | <0.05 |
| Rh | <0.05 |
| Pd | <0.05 |
| Ag | <0.01 |
| Cd | <0.05 |
| In | <0.05 |
| Sn | <0.05 |
| Sb | <0.05 |
| Te | <0.05 |
| I | <0.05 |
| Cs | <0.1 |
| Ba | <1 |
| La | |
| Ce | 6.8 |
| Pr | 0.44 |
| Nd | 1 |
| Sm | <0.05 |
| Eu | <0.05 |
| Gd | <0.05 |
| Tb | <0.05 |
| Dy | <0.05 |
| Ho | <0.05 |
| Er | <0.05 |
| Tm | <0.05 |
| Yb | <0.05 |
| Lu | <0.05 |
| Hf | <0.05 |
| Ta | <5 |
| W | <0.05 |
| Re | <0.05 |
| Os | <0.05 |
| Ir | <0.05 |
| Pt | <0.05 |
| Au | <0.5 |
| Hg | <0.1 |
| Tl | <0.05 |
| Pb | <0.01 |
| Bi | <0.01 |
| Th | <0.001 |
| U | <0.001 |
| C | 140 |
| N | <10 |
| O | 290 |
| S | <10 |
| H | 2.9 |

(Regarding the Color Irregularities of Target in this Example)

As discussed above, when the content of oxygen as an impurity is high, color irregularities in the target occurs. Especially, color irregularities tend to occur when the oxygen content is uneven and variable. As a result of color irregularities in the target, splash which is caused by oxygen would form during the sputtering, and leads to failure in forming uniform film.

In addition, when this occurs, the amount of oxides naturally becomes high, leading to the occurrence of particles and nodules. Machine processing that removes the oxides that resides at the bottom of the skull ingot is thus effective, and in this Example, observation of the surface of the target did not reveal any color irregularities.

The obtained lanthanum ingot was subjected to a hot press as required, followed by machine processing, and grinding to produce a disc shape target having a dimension of ø140×14 t. The weight of the target was 1.42 kg. This was then joined with a backing plate to form a sputtering target. The target for high-purity lanthanum sputtering having the composition described above was thus obtained. Since the target is highly prone to oxidization, it is preferable to vacuum pack it for storage or transportation.

Comparative Example 4

The Comparative Example 4 illustrates requirements of example 4, that is, an example where the machine processing that removes the oxides residing at the bottom of the skull ingot was not removed.
(Regarding the Color Irregularities of Target in this Comparative Example)

As discussed above, when the content of oxygen as an impurity is high, color irregularities in the target occur. Especially, color irregularities tend to occur when the oxygen content is uneven and variable. As a result of color irregularities in the target, splash which is caused by oxygen would form during the sputtering, and leads to failure in forming uniform film.

In addition, when this occurs, the amount of oxides naturally becomes high, leading to the occurrence of particles and nodules. Especially, machine processing that removes the oxides that resides at the bottom of the skull ingot is thus effective, however, in this Comparative Example, this process was not carried out. As a result observation of the surface of the target revealed the occurrence of color irregularities.

The result of this Comparative Example is shown in Table 17. The purpose of Comparative Example 4 is to compare it with Example 4, and it is obviously not intended to reject the features other than the differing point of machine processing step removing the oxides residing at the bottom of the skull ingot.

TABLE 17

| element | wtppm |
|---------|-------|
| Li | <0.005 |
| Be | <0.01 |
| B | 0.07 |
| F | <5 |
| Na | <0.05 |
| Mg | <0.05 |
| Al | 0.54 |
| Si | 0.11 |
| P | <0.01 |
| Cl | 1 |
| K | <0.01 |
| Ca | <0.05 |
| Sc | <0.005 |
| Ti | 0.05 |
| V | <0.005 |
| Cr | <0.05 |
| Mn | <0.01 |
| Fe | 0.44 |
| Co | <0.01 |
| Ni | 0.31 |
| Cu | 0.54 |
| Zn | <0.05 |
| Ga | <0.05 |
| Ge | <0.1 |
| As | <0.1 |
| Se | <0.05 |
| Br | <0.05 |
| Rb | <0.01 |
| Sr | <0.01 |
| Y | <0.05 |
| Zr | <0.01 |
| Nb | <0.05 |
| Mo | <0.05 |
| Ru | <0.05 |
| Rh | <0.05 |
| Pd | <0.05 |
| Ag | <0.01 |
| Cd | <0.05 |
| In | <0.05 |
| Sn | <0.05 |
| Sb | <0.05 |
| Te | <0.05 |
| I | <0.05 |
| Cs | <0.1 |
| Ba | <1 |
| La | |
| Ce | 4.7 |
| Pr | 0.38 |
| Nd | 0.85 |
| Sm | <0.05 |
| Eu | <0.05 |
| Gd | <0.05 |
| Tb | <0.05 |
| Dy | <0.05 |
| Ho | <0.05 |
| Er | <0.05 |
| Tm | <0.05 |
| Yb | <0.05 |
| Lu | <0.05 |
| Hf | <0.05 |
| Ta | <5 |
| W | <0.05 |
| Re | <0.05 |
| Os | <0.05 |
| Ir | <0.05 |
| Pt | <0.05 |
| Au | <0.05 |
| Hg | <0.1 |
| Tl | <0.05 |
| Pb | <0.01 |
| Bi | <0.01 |
| Th | <0.001 |
| U | <0.001 |
| C | 80 |
| N | <10 |
| O | 160 |
| S | <10 |
| H | 4.6 |

The high-purity lanthanum, the sputtering target produced from the high-purity lanthanum, and the thin film for metal gate having the high-purity lanthanum as the main component, obtained by the present invention do not hinder or interfere with the functions of electronic equipments, and as such, are particularly useful as the electronic material deployed in the vicinity of silicon substrate, and as the materials for gate insulator or the thin film for metal gate.

The invention claimed is:

1. A method for producing high-purity lanthanum comprising the steps of:
    using a crude lanthanum raw material having a purity of 2 to 3N, excluding gas components, as the starting material;
    performing molten salt electrolysis at a bath temperature of 450 to 700° C. to produce lanthanum crystals;
    desalting the lanthanum crystals by vacuum heating at a temperature of no more than 850° C. using a desalting furnace and separating metal and salt by making use of the difference in the vapor pressures;
    and thereafter performing electron beam melting to remove volatile substances.

2. The method for producing high-purity lanthanum according to claim 1, characterized by using an electrolytic bath comprising potassium chloride (KCl), lithium chloride (LiCl), sodium chloride (NaCl), magnesium chloride (MgCl$_2$), and calcium chloride (CaCl$_2$), and lanthanum chloride (LaCl$_3$), as the molten salt electrolytic bath.

3. The method for producing high-purity lanthanum according to claim 2, characterized by performing the molten salt electrolysis using an anode made from Ta.

4. The method for producing high-purity lanthanum according to claim 3, characterized by producing a lanthanum having a purity of 4N or more by reducing a lanthanum fluoride raw material having a purity of 4N or more excluding gas components with calcium, and using the reduced lanthanum as the starting material.

5. The method for producing high-purity lanthanum according to claim 4, characterized by skull melting including induction melting the lanthanum crystals obtained by the molten salt electrolysis, and further subjecting an ingot obtained by the skull melting to electron beam (EB) melting.

6. The method for producing high-purity lanthanum according to claim 5, wherein slow cooling after the skull melting is performed so that segregation of oxides inside the lanthanum ingot no longer exists except for at the bottom of the ingot, removing the oxides and chlorides residing at the bottom of the ingot by subjecting the skull ingot obtained by the slow cooling to machine processing, further acid washing the ingot and subjecting to electron beam (EB) melting.

7. The method according to claim 1, wherein the molten salt electrolysis is performed with use of an anode made from Ta.

8. The method according to claim 1, characterized by producing a lanthanum having a purity of 4N or more by reducing a lanthanum fluoride raw material having a purity of 4N or more excluding gas components with calcium, and using the reduced lanthanum as the starting material.

9. The method according to claim 1, characterized by skull melting including induction melting the lanthanum crystals obtained by the molten salt electrolysis, and further subjecting an ingot obtained by the skull melting to electron beam (EB) melting.

10. The method according to claim 9, wherein slow cooling after the skull melting is performed so that segregation of oxides inside the lanthanum ingot no longer exists except for at the bottom of the ingot, removing the oxides and chlorides residing at the bottom of the ingot by subjecting the skull ingot obtained by the slow cooling to machine processing, further acid washing the ingot and subjecting to electron beam (EB) melting.

11. A high-purity lanthanum having: a purity of 5N or more, excluding rare earth elements and gas components; Al, Fe, and Cu, each at an amount of 1 wtppm or less, as impurities; a total amount of gas components of 1000 wtppm or less; and oxygen concentration of 500 wtppm or less.

12. The high-purity lanthanum according to claim 11, characterized by having a total amount of W, Mo and Ta of 10 wtppm or less, as impurities.

13. The high-purity lanthanum according to claim 11, characterized by having Pb at an amount of 0.1 wtppm or less, Bi at an amount of 0.01 wtppm or less, and U and Th, each at an amount of 1 ppb or less.

14. The high-purity lanthanum according to claim 11, characterized by having an α-ray count of 0.001 cph/cm$^2$ or less.

15. A sputtering target comprising the high-purity lanthanum according to claim 11.

16. A metal gate film formed using the sputtering target according to claim 15.

17. Semi-conductor elements and devices equipped with the metal gate film according to claim 16.

18. A high-purity lanthanum, characterized by having a purity of 5N or more excluding rare earth elements and gas components and by having an α-ray count of 0.001 cph/cm$^2$ or less.

19. The high-purity lanthanum according to claim 18, obtained from lanthanum fluoride having a purity of 4N or more excluding gas components, characterized by having a purity of 4N5 or more excluding gas components, having C at 20 wtppm or less, having Al and Fe each at 5 wtppm or less, and Cu at 1 wtppm or less.

20. The high-purity lanthanum according to claim 18, characterized by having the total amount of W, Mo and Ta at 1 to 10 wtppm.

* * * * *